United States Patent
Uemura

(10) Patent No.: US 11,422,208 B2
(45) Date of Patent: Aug. 23, 2022

(54) MAGNETIC SENSOR

(71) Applicant: ABLIC Inc., Chiba (JP)

(72) Inventor: Hirotaka Uemura, Chiba (JP)

(73) Assignee: ABLIC INC., Chiba (JP)

( * ) Notice: Subject to any disclaimer, the term of this patent is extended or adjusted under 35 U.S.C. 154(b) by 272 days.

(21) Appl. No.: 16/682,585

(22) Filed: Nov. 13, 2019

(65) Prior Publication Data
US 2020/0166587 A1    May 28, 2020

(30) Foreign Application Priority Data

Nov. 27, 2018  (JP) ............................. JP2018-220867

(51) Int. Cl.
*G01R 33/07* (2006.01)
*H01L 43/14* (2006.01)
*H01L 43/06* (2006.01)
*H01L 43/04* (2006.01)

(52) U.S. Cl.
CPC ............. *G01R 33/07* (2013.01); *H01L 43/04* (2013.01); *H01L 43/065* (2013.01); *H01L 43/14* (2013.01)

(58) Field of Classification Search
CPC .. G01R 33/07; G01R 33/075; G01R 33/0052; G01R 33/0017; H01L 43/065; H01L 43/04; H01L 43/14
See application file for complete search history.

(56) References Cited

U.S. PATENT DOCUMENTS

| | | | |
|---|---|---|---|
| 5,711,299 A * | 1/1998 | Manwaring | A61B 5/06 128/899 |
| 7,923,995 B2 | 4/2011 | Schulz | |
| 8,203,329 B2 | 6/2012 | Hohe et al. | |
| 9,116,195 B2 * | 8/2015 | Yamashita | G01R 33/07 |
| 9,645,220 B2 * | 5/2017 | Cesaretti | G01R 35/005 |

(Continued)

FOREIGN PATENT DOCUMENTS

JP    2019174324 A  * 10/2019  ........... G01R 33/025

OTHER PUBLICATIONS

Ajbl et al., "A Fully Integrated Hall Sensor Microsystem for Contactless Current Measurement", IEEE Sensors Journal, vol. 13, No. 6, pp. 2271-2277 (Jun. 2013).

(Continued)

*Primary Examiner* — Dominic E Hawkins
(74) *Attorney, Agent, or Firm* — Crowell & Moring LLP

(57) ABSTRACT

A magnetic sensor includes a magneto-sensitive portion (105); an excitation wiring (110) formed in a wiring region above the magneto-sensitive portion (105) through intermediation of an insulating film (12), the excitation wiring (110) including a plurality of conductor portions (1101, 1102, 1103, 1104, and 1105) arranged in in order across at least one radial direction from a center axis of the magneto-sensitive portion (105); a current flowing through the excitation wiring (110) having a current density of which an absolute value becomes zero in a vicinity of a center of the magneto-sensitive portion (105) and continuously increases toward an outer side of the magneto-sensitive portion (105); and a magnetic field generated by the current flowing through the excitation wiring (110) in a direction vertical to the surface of the magneto-sensitive portion (105).

9 Claims, 15 Drawing Sheets

(56) References Cited

U.S. PATENT DOCUMENTS

2010/0117638 A1\* 5/2010 Yamashita ........... G01R 35/005
324/233
2021/0116518 A1\* 4/2021 Gokita ................ G01R 33/025

OTHER PUBLICATIONS

Trontelj et al., "CMOS Integrated Magnetic Field Source Used as a Reference in Magnetic Field Sensors on Common Substrate", IEEE Proceedings of IMTC '94 May 10-12, pp. 461-463 (May 10-12, 1994).

\* cited by examiner

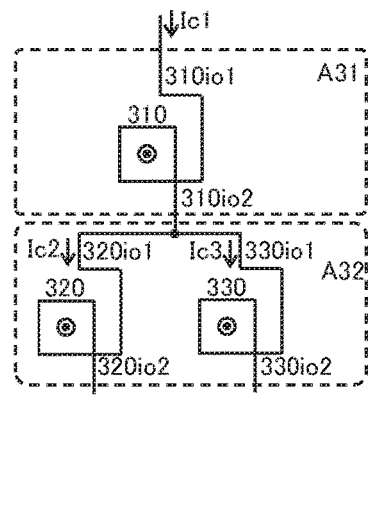
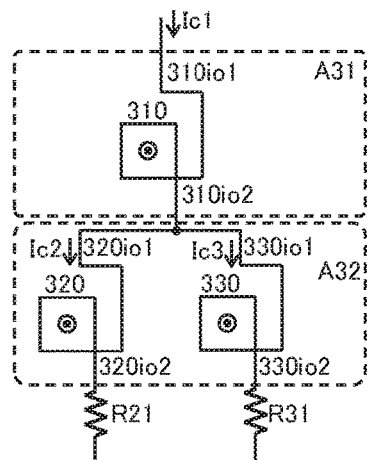
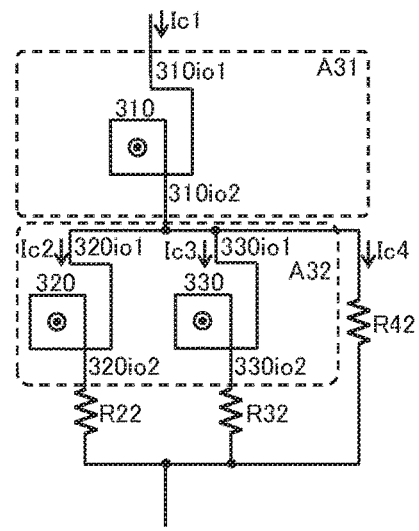
FIG. 5A     FIG. 5B     FIG. 5C
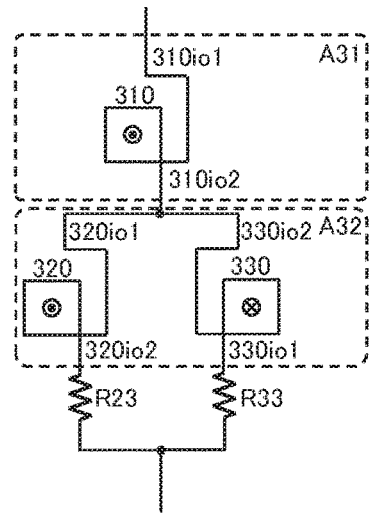
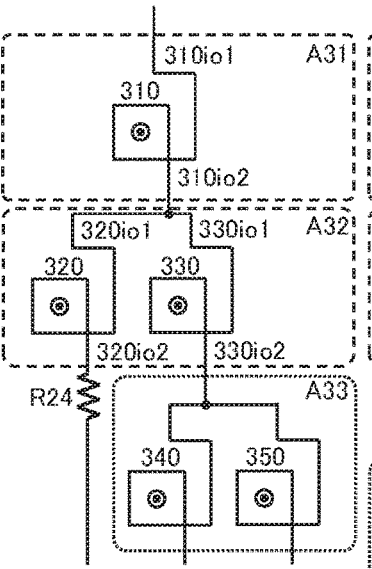
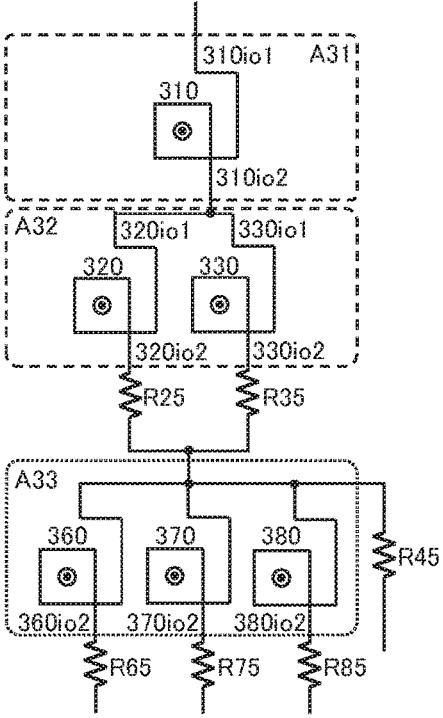
FIG. 5D     FIG. 5E     FIG. 5F

PRIOR ART

MAGNETIC SENSOR

RELATED APPLICATIONS

This application claims priority to Japanese Patent Application No. 2018-220867 filed on Nov. 27, 2018, the entire content of which is incorporated herein by reference.

BACKGROUND OF THE INVENTION

1. Field of the Invention

The present invention relates to a magnetic sensor, and more particularly, to a magnetic sensor including excitation wiring for a sensitivity test.

2. Description of the Related Art

Hitherto, as a technology of testing sensitivity of a magnetic sensor element formed on a semiconductor substrate, the following technology has been proposed. Excitation wiring is formed in the vicinity of a magneto-sensitive portion of the magnetic sensor element in a process of manufacturing the magnetic sensor element, and a current is applied to the excitation wiring so that a test magnetic field is generated.

As the excitation wiring used for the magnetic sensor element to detect a magnetic field generated in a direction vertical to the surface of the semiconductor substrate, for example, a spiral wiring arranged above the magneto-sensitive portion, and a linear wiring arranged beside the magneto-sensitive portion are known (see, for example, U.S. Pat. Nos. 7,923,995 and 8,203,329, A. Ajbl et al., IEEE Sensors Journal, vol. 13, 2271 (2013), and J. Trontelj et al., IEEE Proceedings of IMTC '94).

Regarding the sensitivity test for the magnetic sensor element using the excitation wiring, in J. Trontelj et al., IEEE Proceedings of IMTC '94, non-uniformity of the test magnetic field is described. In many cases, since the magnetic sensor element is used under a uniform magnetic field, conversion of a non-uniform test magnetic field into a uniform magnetic field is necessary in the sensitivity test for the magnetic sensor element using the excitation wiring. In the conversion, the overlap of the magneto-sensitive portion of the magnetic sensor element and a spatial distribution of the test magnetic field should be considered.

In this case, for example, when a Hall element is used as the magnetic sensor element, the shape of the magneto-sensitive portion affects the distribution of a Hall current, and the effect varies by the influence of impurity implanting and diffusing steps for forming the Hall element. Even though the excitation wiring generates the test magnetic field with the same distribution, a coefficient for converting a non-uniform test magnetic field into a uniform magnetic field varies depending on the shape of the magneto-sensitive portion.

As described above, the sensitivity test for the magnetic sensor element using the excitation wiring described in the prior art is affected by manufacturing variations of the magneto-sensitive portion, and hence it has been difficult to perform a high-accuracy test.

SUMMARY OF THE INVENTION

In view of the above, the present invention has an object to provide a magnetic sensor that allows a high-accuracy test without being affected by manufacturing variations of a magneto-sensitive portion.

A magnetic sensor according to an embodiment of the present invention, includes a magneto-sensitive portion; and an excitation wiring formed in a wiring region above the magneto-sensitive portion through intermediation of an insulating film, the excitation wiring having a plurality of conductor portions arranged in order across at least one radial direction from a center axis of the magneto-sensitive portion, the center axis being normal to a surface of the magneto-sensitive portion; a current flowing through the excitation wiring having a current density of which an absolute value becomes zero in a vicinity of a center of the magneto-sensitive portion and continuously increases toward an outer side of the magneto-sensitive portion; and a magnetic field generated by the current flowing through the excitation wiring in a direction vertical to the surface of the magneto-sensitive portion.

According to one embodiment of the present invention, the excitation wiring is constructed to have a current flowing through the excitation wiring of which the absolute value of the current density reaches zero in the vicinity of a center of the magneto-sensitive portion and continuously increases toward an outer side of the magneto-sensitive portion, so that a uniform test magnetic field is generated by the excitation wiring in a predetermined range extending from the vicinity of the center of the magneto-sensitive portion toward the outer side. The magneto-sensitive portion is hence formed to have a size within the predetermined range to permit a generation of a uniform test magnetic field in the magneto-sensitive portion. As a result, in the sensitivity test, the conversion from a non-uniform magnetic field to a uniform magnetic field is not required, and hence a high-accuracy sensitivity test can be performed without being affected by the manufacturing variations of the magneto-sensitive portion.

BRIEF DESCRIPTION OF THE DRAWINGS

FIG. 5A, FIG. 5B, FIG. 5C, FIG. 5D, FIG. 5E, and FIG. 5F are circuit diagrams for illustrating electrical connection between one excitation wiring and other excitation wirings in the third embodiment of the present invention.

FIG. 6A is a top view for illustrating a magnetic sensor according to a fourth embodiment of the present invention.

DETAILED DESCRIPTION OF THE PREFERRED EMBODIMENTS

Before embodiments of the present invention are described, a magnetic sensor 140 in the prior art is described (see, for example, J. Trontelj et al., IEEE Proceedings of IMTC '94).

Figure 14:
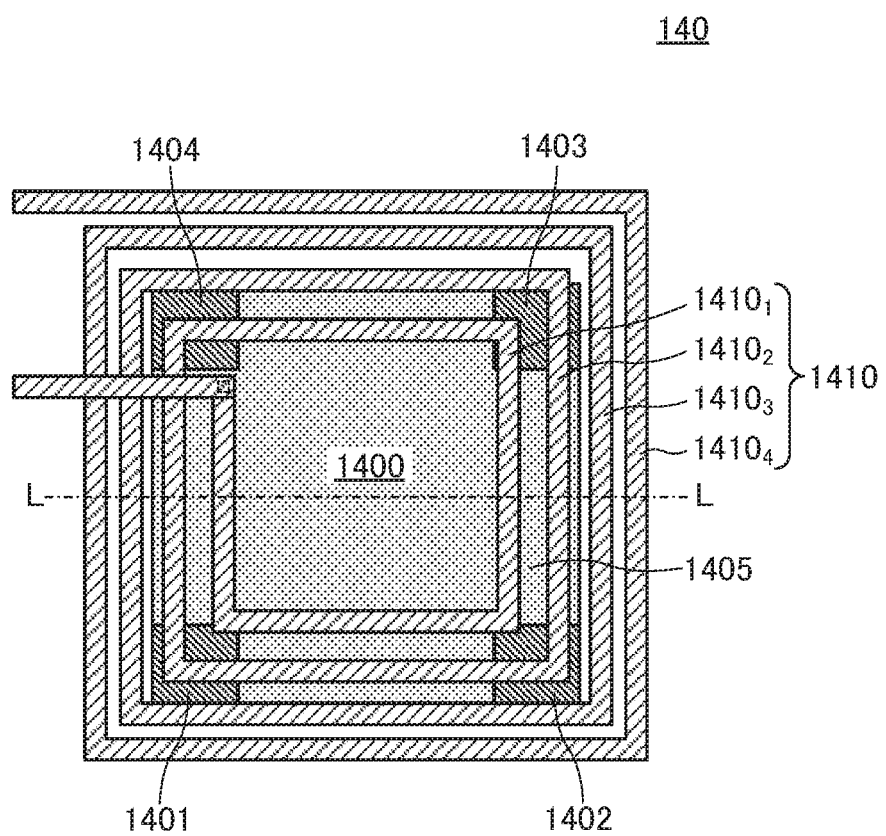
FIG. 14 is a top view for illustrating a magnetic sensor in prior art.

FIG. 14 is a top view for illustrating the magnetic sensor 140 in the prior art. The magnetic sensor 140 includes a Hall element 1400 and excitation wiring 1410.

The Hall element 1400 includes a magneto-sensitive portion 1405, and electrodes 1401, 1402, 1403, and 1404 formed on the surface of the magneto-sensitive portion 1405.

The excitation wiring 1410 is formed above the magneto-sensitive portion 1405 through intermediation of an insulating film (not shown), and includes a plurality of (in this case, four) conductor portions $1410_1$, $1410_2$, $1410_3$, and $1410_4$ arranged in this order to cross a radial direction (for example, radial direction along the line L-L) from a center axis of the magneto-sensitive portion 1405. The center axis lies in a normal direction to the surface of the magneto-sensitive portion 1405. In this case the excitation wiring 1410 is a coil formed on the surface and a main portion is made of a single wiring material.

An interval between centers of adjacent two of the conductor portions $1410_1$, $1410_2$, $1410_3$, and $1410_4$ is constant, and widths of the conductor portions $1410_1$, $1410_2$, $1410_3$, and $1410_4$ are all the same. By the current flowing through the excitation wiring 1410, a test magnetic field corresponding to the magnitude and the direction of the current is applied to the magneto-sensitive portion 1405 of the Hall element 1400 in a direction vertical to the surface of the magneto-sensitive portion 1405.

Figure 15:
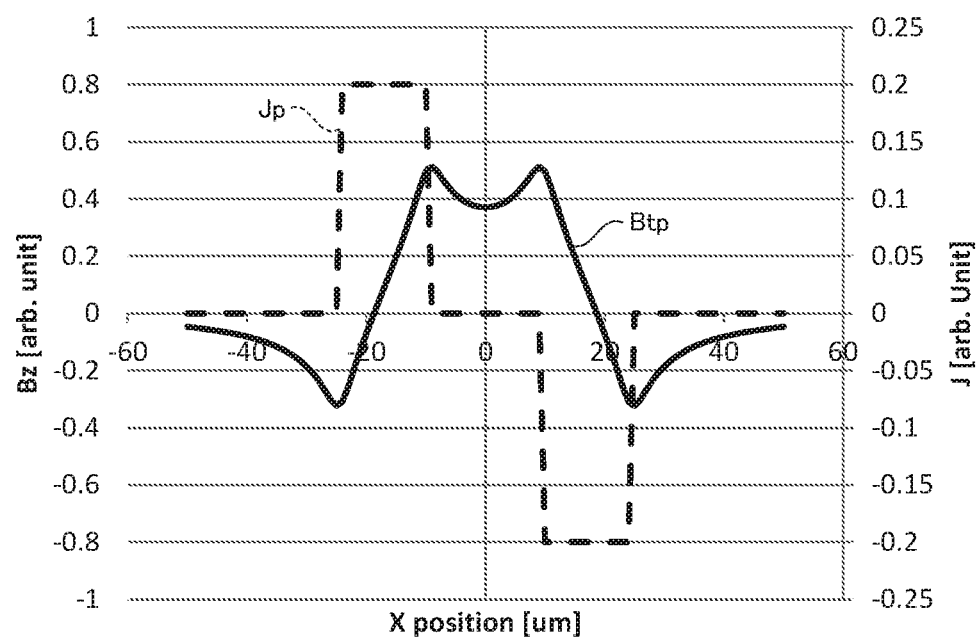
FIG. 15 is a graph for showing a distribution of a current density of a current flowing through excitation wiring and a distribution of a vertical magnetic field generated by the current flowing through the excitation wiring on the line L-L in the magnetic sensor illustrated in FIG. 14.

FIG. 15 is a graph for showing a distribution of a current density Jp of a current flowing through the excitation wiring 1410 and a distribution of a vertical test magnetic field Btp generated by the current flowing through the excitation wiring 1410 along the line illustrated in FIG. 14. For example, the magneto-sensitive portion 1405 of the Hall element 1400 is located between −20 μm<x<20 μm, and the test magnetic field Btp generated by the current flowing through the excitation wiring 1410 is non-uniform on the magneto-sensitive portion 1405 of the Hall element 1400.

A method of performing the sensitivity test in the above-mentioned magnetic sensor 140 is described. First, a current is applied to the excitation wiring 1410 so that the test magnetic field Btp is generated. The test magnetic field Btp is, as described above, non-uniform on the magneto-sensitive portion 1405 of the Hall element 1400. Driving the Hall element 1400, an output signal corresponding to the non-uniform test magnetic field Btp is processed by an output circuit (not shown) to obtain a measurement value Stp corresponding to the non-uniform test magnetic field Btp.

The non-uniform test magnetic field. Btp is converted into a uniform magnetic field Btp', and thus a correlation between the measurement value Stp and the uniform magnetic field Btp' can be obtained. The sensitivity test can therefore be performed by comparing the measurement value Stp with respect to the uniform magnetic field Btp' with a design value Sdp with respect to the uniform magnetic field Btp'.

In the conversion of the non-uniform test magnetic field Btp into the uniform magnetic field Btp', a table obtained by comparing results of measurement performed with respect to similar elements in each of a uniform magnetic field environment and a non-uniform test magnetic field environment is used, or the conversion is performed through numeric calculation. In any case, the accuracy of the conversion from the teat magnetic field Btp to the uniform magnetic field Btp' reduces because of the manufacturing variations of the Hall element 1400.

In contrast, in the embodiments of the present invention described in detail below, the conversion from the non-uniform magnetic field to the uniform magnetic field can be dispensable.

Embodiments of the present invention are described in detail with reference to the drawings.

Figure 1:
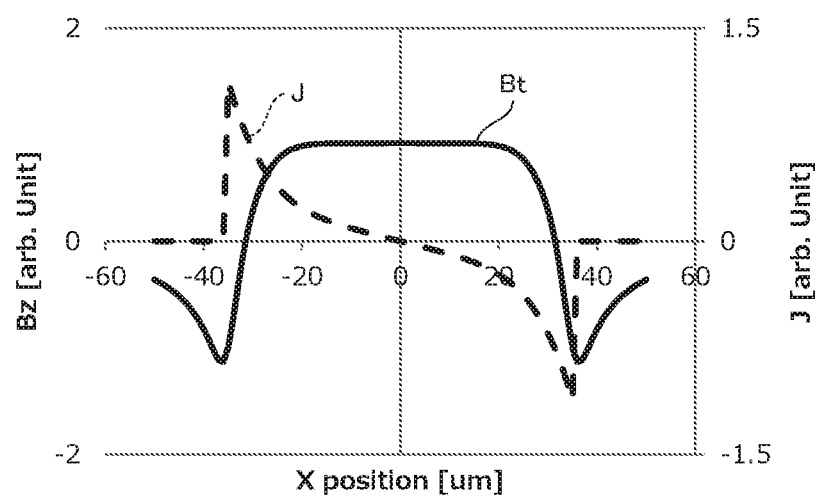
FIG. 1 is a graph for showing a distribution of a current density of a current flowing through excitation wiring and a distribution of a test magnetic field generated by the current flowing through the excitation wiring in each embodiment of the present invention.

FIG. 1 is a graph for showing an example of a distribution of a current density J of a current flowing through excitation wiring and a distribution of a vertical test magnetic field Bt generated in each embodiment and each modification example of the embodiment of the present invention which are illustrated in FIG. 2A to FIG. 13C. An absolute value of the current density J of the current flowing through the excitation wiring reaches zero in the vicinity of the center of the magneto-sensitive portion of the magnetic sensor element, and continuously increases toward the outer side of the magneto-sensitive portion. When the current density J of the current flowing through the excitation wiring has a distribution as shown in FIG. 1, and the magneto-sensitive portion of the magnetic sensor element is located between, for example, −20 μm<x<20 μm, a uniform test magnetic field Bt can be generated over the entire magneto-sensitive portion. Even though the magnetic sensor element has manufacturing variations, a predetermined test magnetic field can hence be applied with high accuracy, and a high-accuracy sensitivity test can be performed.

Next, with reference to the drawings, descriptions are given of specific embodiments and modification examples of the embodiments for achieving the current density distribution of the excitation wiring as shown in FIG. 1. Components that mutually correspond to each other in FIG. 2A to FIG. 13C are denoted by the same reference symbols, and a redundant description is omitted as appropriate.

First Embodiment

Figure 2A:
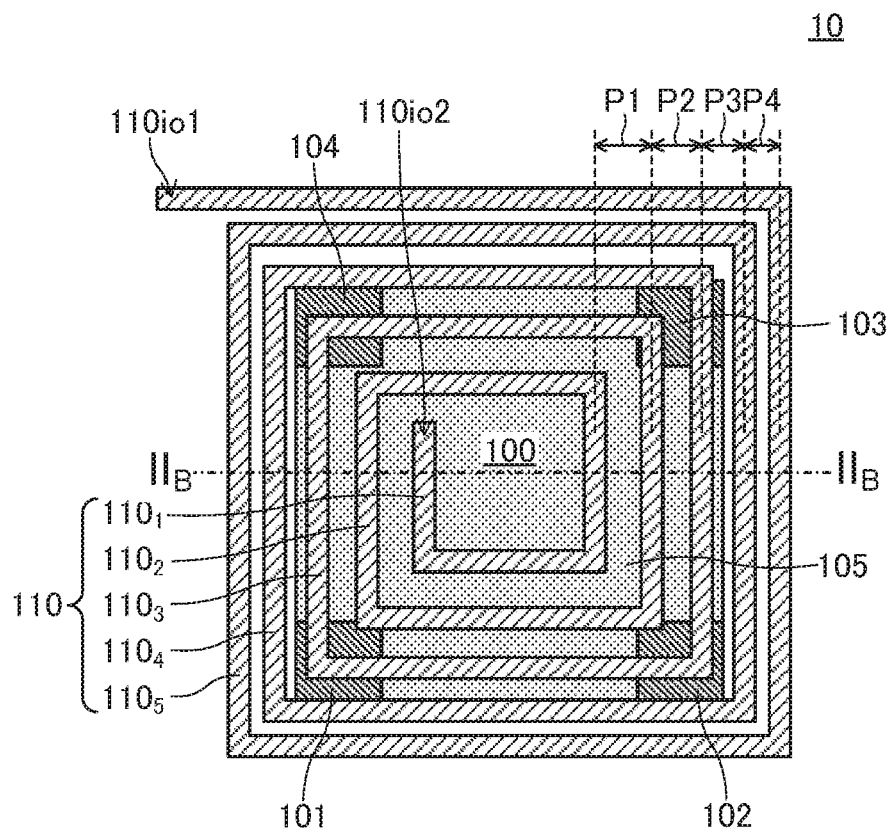
FIG. 2A is a top view for illustrating a magnetic sensor according to a first embodiment of the present invention.
Figure 2B:
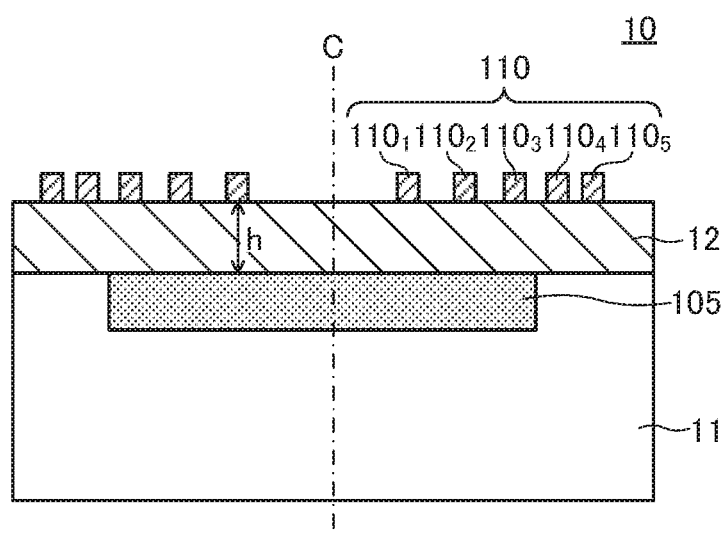
FIG. 2B is a sectional view taken along the line $II_B$-$II_B$ of FIG. 2A.

FIG. 2A and FIG. 2B are views for illustrating a magnetic sensor 10 according to the first embodiment of the present invention. FIG. 2A is a top view of the magnetic sensor 10, and FIG. 2B is a sectional view taken along the line $II_B$-$I_B$ of FIG. 2A.

As illustrated in FIG. 2A and FIG. 2B, the magnetic sensor 10 according to the first embodiment includes a Hall element 100 serving as the magnetic sensor element, and excitation wiring 110.

The Hall element 100 includes a magneto-sensitive portion 105 formed on a surface of a semiconductor substrate 11, and electrodes 101, 102, 103, and 104 formed at four corners of a surface of the magneto-sensitive portion 105. In the Hall element 100 of a condition in which a magnetic field is applied to the magneto-sensitive portion 105, supply of a Hall current between the electrodes 101 and 103 serving as drive current supply electrodes generates a potential difference, which is caused by the Lorentz force, between the electrodes 102 and 104 serving as Hall voltage output electrodes. When the potential difference generated between the electrodes 102 and 104 is measured, an output signal proportional to the magnetic field applied to the magneto-sensitive portion 105 can be obtained.

In this case, the electrodes 101, 102, 103, and 104 are electrically connected to an input circuit (not shown) which applies current or voltage to the Hall element 100 and an output circuit (not shown) which processes the output signal of the Hall element 100. Further, the Hall element 100 is driven by, for example, a spinning current method in which the drive current supply electrodes and the Hall voltage output electrodes are alternately switched.

The excitation wiring 110 is formed above the magneto-sensitive portion 105 through intermediation of an insulating film 12 formed on the semiconductor substrate 11. The excitation wiring 110 includes a plurality of (in this case, five) conductor portions $110_1$, $110_2$, $110_3$, $110_4$, and $110_5$ arranged in this order across a radial direction from a center axis C of the magneto-sensitive portion 105 (for example, radial direction along the line $II_B$-$II_B$), and input/output terminals 110$io$1 and 110$io$2 for injecting currents. The center axis C lies in a normal direction to the surface of the magneto-sensitive portion 105. In this case the excitation wiring 110 is a coil formed on a plane and a main portion is made of a single wiring material.

As a main feature of the first embodiment, in the conductor portions $110_1$, $110_2$, $110_3$, $110_4$, and $110_5$, intervals P1, P2, P3, and P4 each between centers of adjacent conductor portions satisfy an inequality P1>P2>P3>P4 as illustrated in FIG. 2A. That is, the interval decreases as separating away from the center axis C of the magneto-sensitive portion 105 in the radial direction.

With this configuration, when a predetermined current is applied to the excitation wiring 110 through the input/output terminals 110$io$1 and 110$io$2, a uniform test magnetic field Bt as shown in FIG. 1 can be generated over the entire magneto-sensitive portion 105. The reason is described in the following.

In the vicinity of the center axis C of the magneto-sensitive portion 105, no excitation wiring 110 is arranged, and hence the current density is substantially zero. As separating away from the center axis C of the magneto-sensitive portion 105 in the radial direction, the conductor portions $110_1$, $110_2$, $110_3$, $110_4$, and $110_5$ forming the excitation wiring 110 are arranged in order, but the density of the conductor portions decreases as approaching the center axis C, and hence the current density decreases. On the other hand, as separating away from the center axis C in the radial direction, that is, toward the outer side of the magneto-sensitive portion 105, the density of the conductor portions $110_1$, $110_2$, 1103, 1104, and 1105 increases, and hence the current density increases. Accordingly, by arranging the conductor portions $110_1$, $110_2$, $110_3$, $110_4$, and $110_5$ with appropriate center-to-center intervals P1, P2, P3, and P4, the current density distribution shown in FIG. 1 can be approximately achieved, and a uniform test magnetic field can be generated over the entire magneto-sensitive portion 105.

Next, a method of performing the sensitivity test in the magnetic sensor 10 according to the first embodiment is described. First, a current is applied to the excitation wiring 110 through the input/output terminals 110$io$1 and 110$io$2 so that the test magnetic field Bt is generated. Driving the Hall element 100 in this condition, a measurement value St is obtained after the output signal corresponding to the test magnetic field Bt is processed by the output circuit. The test magnetic field Bt is uniform on the magneto-sensitive portion 105, and hence the sensitivity test can be performed by comparing the measurement value St for the test magnetic field Bt with a design value Sd for the test magnetic field Bt.

At this point, in accordance with a difference between the measurement value St and the design value Sd, a part of the input circuit or the output circuit, for example, a drive current of the Hall element 100 or a gain of an amplifier in the output circuit to process the output signal of the Hall element 100 may be adjusted. With this adjustment, a high-accuracy magnetic sensor with corrected sensitivity can be obtained.

As described above, according to the magnetic sensor 10 of the first embodiment, unlike the magnetic sensor 140 of the prior art illustrated in FIG. 14, conversion from the non-uniform test magnetic field Btp to the uniform magnetic field Btp' is not required, and hence a high-accuracy sensitivity test can be performed irrespective of the manufacturing variations of the Hall element 100.

The magnetic sensor 10 according to the first embodiment is manufactured, for example, as described below.

First, a single crystal silicon substrate 11 having a P-type conductivity is prepared as the semiconductor substrate 11, and, for example, phosphorus atoms are ion-implanted as impurities into the single crystal silicon substrate 11. In this manner, the N-type magneto-sensitive portion 105 is formed. After that, phosphorus atoms are selectively ion-implanted so that the electrodes 101, 102, 103, and 104 are formed on the surface of the magneto-sensitive portion 105. In this manner, the Hall element 100 is formed. Next, the insulating film 12 is formed by forming a silicon oxide film on the single crystal silicon substrate 11 by chemical vapor deposition so as to cover the Hall element 100. Then, the excitation wiring 110 is formed on the insulating film 12 by, similarly to an aluminum wiring step performed in general semiconductor manufacturing, forming an aluminum film by sputtering and subjecting the aluminum film to photolithography and etching.

Second Embodiment

Figure 3A:
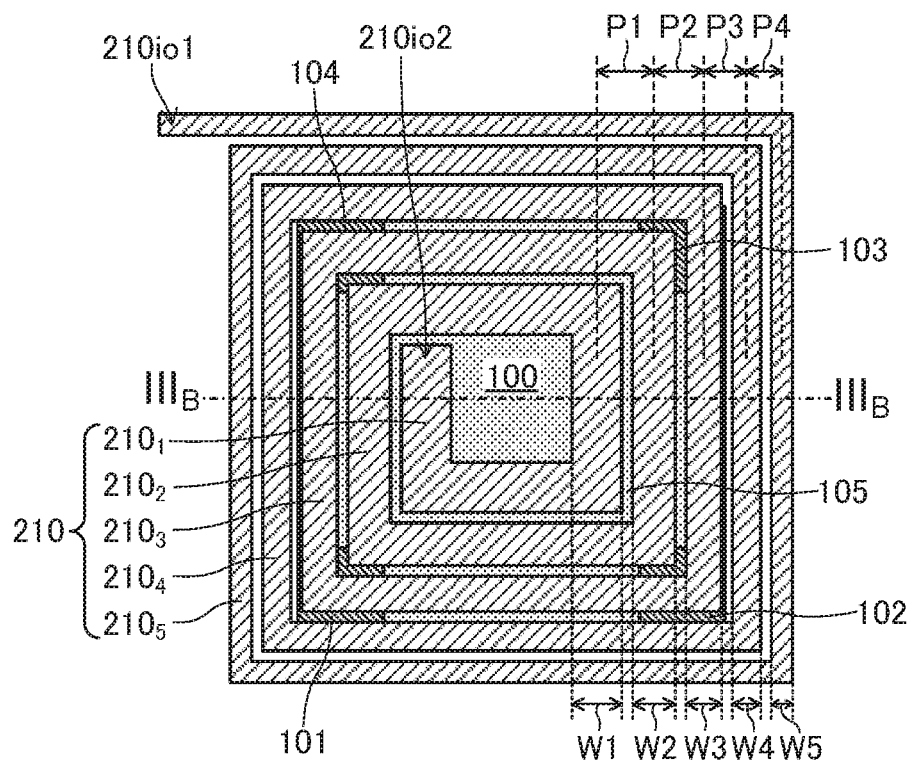
FIG. 3A is a top view for illustrating a magnetic sensor according to a second embodiment of the present invention.
Figure 3B:
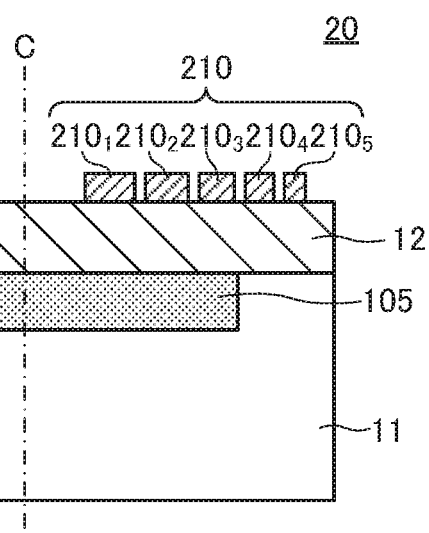
FIG. 3B is a sectional view taken along the line of FIG. 3A.

FIG. 3A and FIG. 3B are views for illustrating a magnetic sensor 20 according to the second embodiment of the present invention. FIG. 3A is a top view of the magnetic sensor 20, and FIG. 3B is a sectional view taken along the line $III_B$-$III_B$ of FIG. 3A.

As illustrated in FIG. 3A and FIG. 3B, the magnetic sensor 20 according to the second embodiment includes a Hall element 100 which has the same configuration as that of the Hall element in the magnetic sensor 10 according to the first embodiment, and excitation wiring 210.

The excitation wiring 210 is formed above the magneto-sensitive portion 105 through intermediation of the insulating film 12 formed on the semiconductor substrate 11. The excitation wiring 210 includes a plurality of (in this case, five) conductor portions $210_1$, $210_2$, $210_3$, $210_4$, and $210_5$ arranged in this order across a radial direction from the center axis C of the magneto-sensitive portion 105 (for example, radial direction along the line $III_B$-$III_B$), and input/output terminals 210io1 and 210io2 for injecting currents. The center axis C lies in a normal direction to the surface of the magneto-sensitive portion 105. In this case the excitation wiring 210 is a coil formed on a plane and a main portion is made of a single wiring material.

As a main feature of the magnetic sensor 20 according to the second embodiment, as in the first embodiment, in the conductor portions $210_1$, $210_2$, $210_3$, $210_4$, and $210_5$, intervals P1, P2, P3, and P4 each between centers of adjacent conductor portions satisfy an inequality P1>P2>P3>P4 as illustrated in FIG. 3A. That is, the interval decreases as separating away from the center axis C of the magneto-sensitive portion 105 in the radial direction. Further, as another feature of the second embodiment, the widths W1, W2, W3, W4, and W5 of the respective conductor portions $210_1$, $210_2$, $210_3$, $210_4$, and $210_5$ satisfy an inequality W1>W2>W3>W4>W5. That is, the width decreases as separating away from the center axis C of the magneto-sensitive portion 105 in the radial direction.

In this case, the widths W1, W2, W3, W4, and W5 of the respective conductor portions can be determined so that, for example, with respect to the intervals P1, P2, P3, and P4 for achieving a uniform magnetic field distribution, a distance S between adjacent conductor portions becomes constant. It is preferred to set the distance S between the conductor portions to, for example, a value determined based on the minimum wiring interval that can be stably obtained in the manufacturing process and based on the minimum wiring width determined in consideration of an electromigration resistance.

With this configuration, when a predetermined current is applied to the excitation wiring 210 through the input/output terminals 210io1 and 210io2, as compared to the first embodiment, an even more uniform test magnetic field can be generated over the entire magneto-sensitive portion 105. The reason is described in the following.

For example, in the first embodiment illustrated in FIG. 2A and FIG. 2B, if the conductor portions $110_1$, $110_2$, $110_3$, $110_4$, and $110_5$ are formed to have constant widths, the current density in the conductor portion is the same in any conductor portion irrespective of the distance from the center axis C. Further, the distance between the adjacent conductor portions increases as approaching the center axis C. In such a case, particularly when a distance h between the magneto-sensitive portion 105 and the excitation wiring 110 in a direction vertical to the semiconductor substrate 11 is small, the distance between the adjacent conductor portions is large, and the current density in the conductor portion is large, the uniformity of the test magnetic field reduces since a large change locally occurs in the magnetic field in the vicinity of the conductor portion.

In contrast, in the second embodiment, the density of the conductor portions forming the excitation wiring 210 increases as separating away from the center axis C in the radial direction, and hence, similarly to the first embodiment, the current density distribution shown in FIG. 1 can be approximately achieved. In addition, the following effect can be obtained. In the second embodiment, the widths of the conductor portions $210_1$, $210_2$, $210_3$, $210_4$, and $210_5$ forming the excitation wiring 210 increases as approaching the center axis C of the magneto-sensitive portion 105, and hence the current density in the conductor portion decreases step by step as approaching the center axis C. At the same time the distance S between the adjacent conductor portions is maintained small irrespective of the distance from the center axis C. That is, even in the vicinity of the center axis C, the current density in the conductor portion forming the excitation wiring 210 is small, and the distance S between the adjacent conductor portions is small, thereby suppressing the local change in the magnetic field in the vicinity of the conductor portion, and improving the uniformity of the test magnetic field.

In this case, the magnetic sensor 20 according to the second embodiment can be manufactured by a method similar to that for the magnetic sensor 10 according to the first embodiment.

Third Embodiment

Figure 4A:
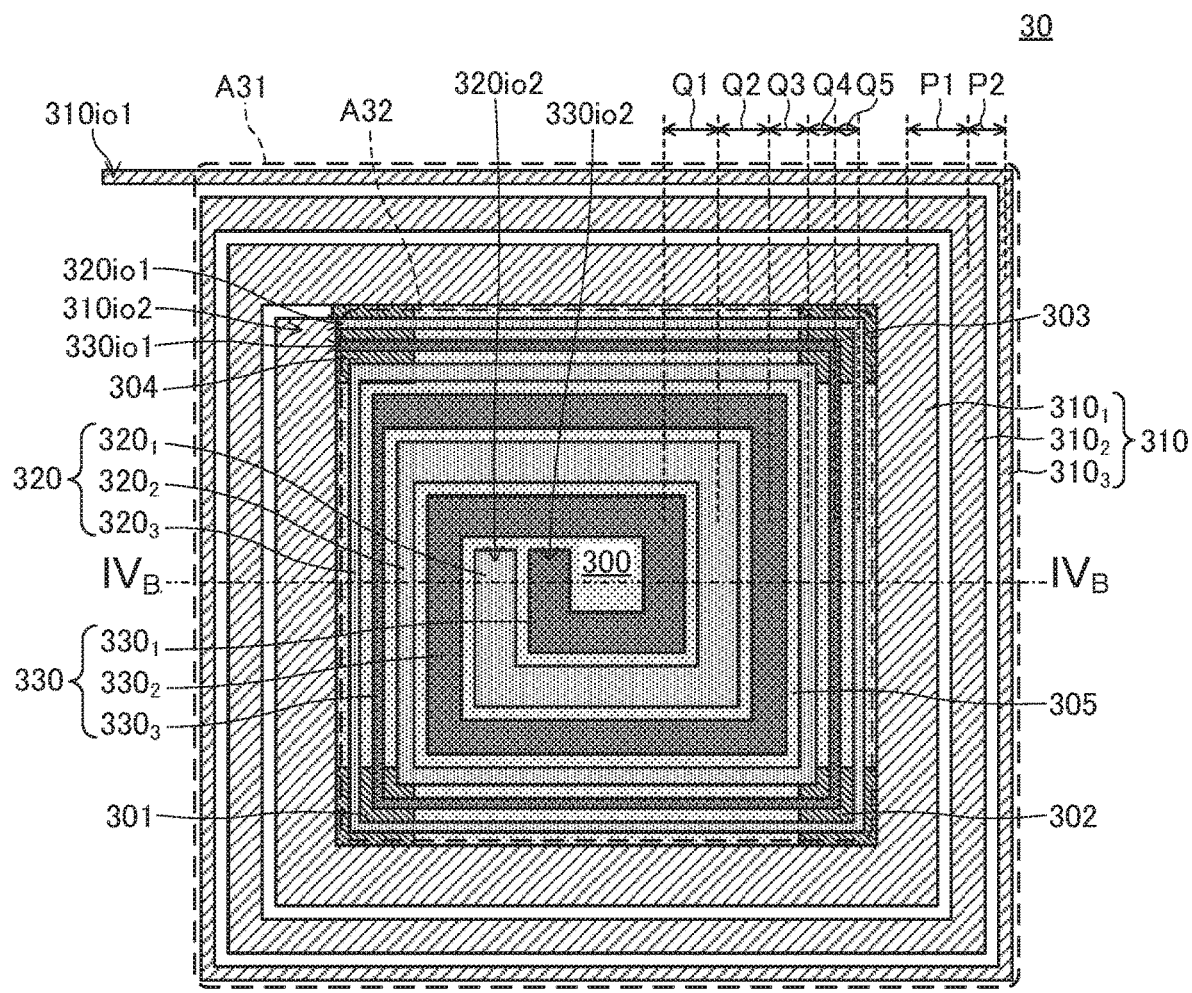
FIG. 4A is a top view for illustrating a magnetic sensor according to a third embodiment of the present invention.
Figure 4B:
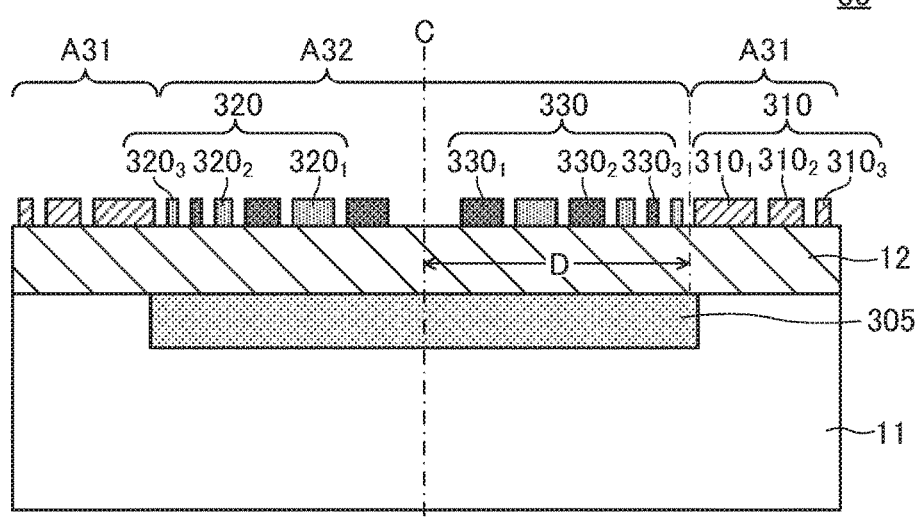
FIG. 4B is a sectional view taken along the line $IV_B$-$IV_B$ of FIG. 4A.

FIG. 4A and FIG. 4B are views for illustrating a magnetic sensor 30 according to the third embodiment of the present invention. FIG. 4A is a top view of the magnetic sensor 30, and FIG. 4B is a sectional view taken along the line $IV_B$-$IV_B$ of FIG. 4A.

As illustrated in FIG. 4A and FIG. 4B, the magnetic sensor 30 according to the third embodiment includes a Hall element 300, and excitation wiring including the first excitation wiring 310, the second excitation wiring 320, and the third excitation wiring 330.

The Hall element 300 includes a magneto-sensitive portion 305 formed on a surface of a semiconductor substrate 11, and electrodes 301, 302, 303, and 304 formed at four corners of the surface of the magneto-sensitive portion 305. The magneto-sensitive portion 305 of the Hall element 300 in the third embodiment has a size that is larger than that of the magneto-sensitive portion 105 of the Hall element 100 in each of the first and second embodiments. The operation and the drive method for the Hall element 300 are similar to those for the Hall element 100 in each of the first and second embodiments, and hence description thereof is omitted herein.

The excitation wiring 310 is formed in a first wiring region A31 above the magneto-sensitive portion 305 through intermediation of the insulating film 12 formed on the semiconductor substrate 11. The excitation wiring 310 includes a plurality of (in this case, three) conductor portions $310_1$, $310_2$, and $310_3$ arranged in this order across a radial direction from the center axis C of the magneto-sensitive portion 305 (for example, radial direction along the line $IV_B$-$IV_B$), and input/output terminals 310io1 and 310io2 for injecting currents. The center axis C lies in a normal direction to the surface of the magneto-sensitive portion 305. In this case the excitation wiring 310 is a coil formed on a plane and a main portion is made of a single wiring material.

The excitation wiring 320 is formed in a second wiring region A32 positioned on the inner side of the first wiring region A31 above the magneto-sensitive portion 305 through intermediation of the insulating film 12 formed on the semiconductor substrate 11. The excitation wiring 320 includes a plurality of (in this case, three) conductor portions $320_1$, $320_2$, and $320_3$ arranged in this order across the radial direction from the center axis C of the magneto-sensitive portion 305, and input/output terminals 320io1 and 320io2 for injecting currents. The excitation wiring 330 is formed in the wiring region A32 above the magneto-sensitive portion 305 through intermediation of the insulating film 12 formed on the semiconductor substrate 11. The excitation wiring 330 includes a plurality of (in this case, three conductor portions $330_1$, $330_2$, and $330_3$ arranged in this order across the radial direction from the center axis C of the magneto-sensitive portion 305, and input/output terminals 330io1 and 330io2 for injecting currents. The conductor portions $320_1$, $320_2$, and $320_3$ of the excitation wiring 320 and the conductor portions $330_1$, $330_2$, and $330_3$ of the excitation wiring 330 are alternately arranged. The input/output terminal 320io1 of the excitation wiring 320 and the input/output terminal 330io1 of the excitation wiring 330 are electrically connected in parallel to the input/output terminal 310io2 of the excitation wiring 310. In this case each of the excitation wirings 320 and the 330 is a coil formed on a plane and a main portion is made of a single wiring material.

Next, a main feature of the magnetic sensor 30 according to the third embodiment is described. As illustrated in FIG. 4A, an interval P1 between centers of the conductor portion $310_1$ and the conductor portion $310_2$ of the excitation wiring 310 and an interval P2 between centers of the conductor portion $310_2$ and the conductor portion $310_3$ satisfy an inequality P1>P2. Intervals Q2+Q3 and Q4+Q5 each between centers of two of the conductor portions $320_1$, $320_2$, and $320_3$ of the excitation wiring 320 satisfy an inequality Q2+Q3>Q4+Q5. Intervals Q1+Q2 and Q3+Q4 each between centers of two of the conductor portions $330_1$, $330_2$, and $330_3$ of the excitation wiring 330 satisfy an inequality Q1+Q2>Q3+Q4. That is, the interval between the centers of the conductor portions of each of the excitation wiring 310, the excitation wiring 320, and the excitation wiring 330 decreases as separating away from the center axis C of the magneto-sensitive portion 305 in the radial direction. Further, also in the third embodiment, the width (although not denoted by a reference symbol) of the conductor portion of each of the excitation wiring 310, the excitation wiring 320, and the excitation wiring 330 decreases as separating away from the center axis C of the magneto-sensitive portion 305 in the radial direction.

With this configuration, even though the magneto-sensitive portion 305 has a large size, the current density distribution as shown in FIG. 1 can be achieved with a high approximation accuracy, and a high-accuracy sensitivity test can be performed. The reason is described in the following.

When the interval between the centers of the conductor portions is made smaller as separating away from the center axis C of the magneto-sensitive portion in the radial direction, in a region in which a distance D (see FIG. 4B) from the center axis C is equal to or larger than a certain value, the interval between the centers of the conductor portions becomes smaller than the minimum wiring interval that can be stably obtained in the manufacturing process. In this case, the distance D is determined based on a combination of for example, the distances Q1, Q2, Q3, Q4, and Q5 between the centers of the conductor portions in the excitation wiring 320 and the excitation wiring 330, the minimum wiring interval that can be stably obtained in the manufacturing process, and the minimum wiring width for ensuring the electromigration resistance. When a length from the center axis C of the magneto-sensitive portion to any side of the magneto-sensitive portion is sufficiently smaller than the distance D, as described in the first and second embodiments, a uniform test magnetic field can be applied to the magneto-sensitive portion with single excitation wiring. However, when the length from the center axis C of the magneto-sensitive portion to any side of the magneto-sensitive portion is larger than the distance D, it becomes difficult to apply a uniform magnetic field only with the single excitation wiring.

In view of this, according to the third embodiment, as illustrated in FIG. 4B, a region extending from the center axis C of the magneto-sensitive portion 305 to the distance D is set as the wiring region A32, and a region separated away from the center axis C by the distance D is set as the wiring region A31. Further, the current flowing through the conductor portions arranged in the wiring region A31 is set to be larger than the current flowing through the conductor portions arranged in the wiring region A32. Further, at a boundary between the wiring region A31 and the wiring region A32, the intervals between the centers of the adjacent conductor portions are set to satisfy an inequality P1>Q5. In this manner, the current density distribution shown in FIG. 1 can be achieved. That is, by the excitation wiring 310, the excitation wiring 320, and the excitation wiring 330 of the magnetic sensor 30 according to the third embodiment, though in each of the wiring regions A31 and A32, the interval between the centers of the conductor portions decreases as separating away from the center axis C in the radial direction, the interval between the centers of the adjacent conductor portions can be increased at regions beyond the distance D from the center axis C. Accordingly, a uniform test magnetic field can be generated over a wide range that is equal to or larger than the distance D from the center axis C.

In this case, the magnetic sensor 30 according to the third embodiment can be manufactured by a method similar to that for the magnetic sensor 10 according to the first embodiment.

FIG. 5A to FIG. 5F are circuit diagrams for illustrating various examples of electrical connection among the excitation wiring 310, the excitation wiring 320, and the excitation wiring 330 in the third embodiment. In FIG. 5A to FIG. 5F, spirals represent excitation wirings, and the symbol inside each spiral represents a direction of the test magnetic field generated by the current flowing through the excitation wiring.

FIG. 5A is a circuit diagram for illustrating an example of electrical connection among the excitation wiring 310, the excitation wiring 320, and the excitation wiring 330. A current Ic1 applied from the input/output terminal 310io1 is divided in parallel into a current Ic2 flowing through the excitation wiring 320 and a current Ic3 flowing through the excitation wiring 330. As a result, the currents flowing through the excitation wiring 310, the excitation wiring 320, and the excitation wiring 330 satisfy an inequalities Ic1>Ic2 and Ic1>Ic3. That is, the current is larger in the wiring region A31 than in the wiring region A32. Accordingly, for example, even though a relationship between the interval Q1 between the centers of the conductor portion $330_1$ and the conductor portion $320_1$ and the interval P1 between the centers of the conductor portion $310_1$ and the conductor portion $310_2$ satisfies an equation Q1=P1, and a relationship between the interval Q2 between the centers of the conductor portion $320_1$ and the conductor portion $330_2$ and the interval P2 between the centers of the conductor portion $310_2$ and the conductor portion $310_3$ satisfies an equation Q2=P2, that is, even though the interval between the centers of the conductor portions in the wiring region A31 is equal to the interval between the centers of the conductor portions in the wiring region A32, the current density of the current flowing through the excitation wiring is larger in the wiring region A31 than in the wiring region A32.

It is preferred to design the relationships among the current Ic1, the current Ic2, and the current Ic3 flowing through the excitation wiring 310, the excitation wiring 320, and the excitation wiring 330, respectively, depending on the interval between the centers of the conductor portions and the width of the conductor portion in each of the excitation wiring 310, the excitation wiring 320, and the excitation wiring 330. For example, when equalities Ic1=Ic2+Ic3 and Ic2=Ic3 hold, and each of the excitation wiring 310, the excitation wiring 320, and the excitation wiring 330 is structured so that a uniform test magnetic field can be obtained, it is preferred to add a resistor R21 and a resistor R31 to the input/output terminal 320io2 and the input/output terminal 330io2, respectively, as illustrated in FIG. 5B so that the excitation wiring 320 and the excitation wiring 330 have equal electrical resistances. Alternatively, potentials of the input/output terminals 310io1, 320io2, and 330io2 may be controlled by an external circuit (not shown).

Further, for example, in order to satisfy a relation Ic1≠Ic2+Ic3, as illustrated in FIG. 5C, a resistor R42 through which a current Ic4 flows and which is unrelated to the test magnetic field may be connected to the excitation wiring 310 so as to be parallel to the excitation wiring 320 and the excitation wiring 330. Also in this case, it is preferred to add a resistor R22 and a resistor R32 to the excitation wiring 320 and the excitation wiring 330, respectively.

Further, in FIG. 5A to FIG. 5C, as an example, description is given of the case in which the currents flow through the excitation wiring 310, the excitation wiring 320, and the excitation wiring 330 in the same direction, but, for example, as illustrated in FIG. 5D, the input/output terminal 320io1 of the excitation wiring 320 and the input/output terminal 330io2 of the excitation wiring 330 may be connected to the input/output terminal 310io2 of the excitation wiring 310 so that the direction of the current flowing through the excitation wiring 330 is opposite to the direction of the current flowing through each of the excitation wiring 310 and the excitation wiring 320. At this time, since the currents flow through the excitation wiring 320 and the excitation wiring 330 in opposite directions, such an effect that the current density in the wiring region A32 becomes smaller than the current density in the wiring region A31 can be obtained. In this case, also it is preferred to add a resistor R23 and a resistor R33 to the input/output terminal 320io2 and the input/output terminal 330io1, respectively.

Further, in FIG. 4A, FIG. 4B, and FIG. 5A to FIG. 5D, the structure in which the excitation wiring related to the test magnetic field is formed from only the excitation wiring 310, the excitation wiring 320, and the excitation wiring 330 was described as an example, but other excitation wiring may be used as required. That is, in the above, a structure including two wiring regions, specifically, the wiring regions A31 and A32 is described as an example, but as illustrated in FIG. 5E and FIG. 5F, another wiring region A33 may be formed on the inner side of the wiring region A32 as required. In this case, the excitation wiring in the adjacent wiring region can be connected similarly to that in the case of the wiring regions A31 and A32. With this configuration, a uniform test magnetic field can be generated over a wider region.

Specifically, for example, in the example illustrated in FIG. 5E, excitation wiring 340 and excitation wiring 350 that are connected in parallel to the input/output terminal 330io2 of the excitation wiring 330 are formed in the wiring region A33. At this time, it is preferred to add a resistor R24 to the input/output terminal 320io2. Further, in the example illustrated in FIG. 5F, excitation wiring 360, excitation wiring 370, and excitation wiring 380 that are connected in parallel to a node at which the input/output terminal 320io2 of the excitation wiring 320 and the input/output terminal 330io2 of the excitation wiring 330 are connected in common through resistors R25 and R26 are formed in the wiring region A33. At this time, it is preferred to connect a resistor R45 in parallel to the excitation wiring 360, the excitation wiring 370, and the excitation wiring 380, and further to add a resistor R65, a resistor R75, and a resistor R85 to the input/output terminal 360io2 of the excitation wiring 360, the input/output terminal 370io2 of the excitation wiring 370, and the input/output terminal 380io2 of the excitation wiring 380, respectively.

Fourth Embodiment

Figure 6B:
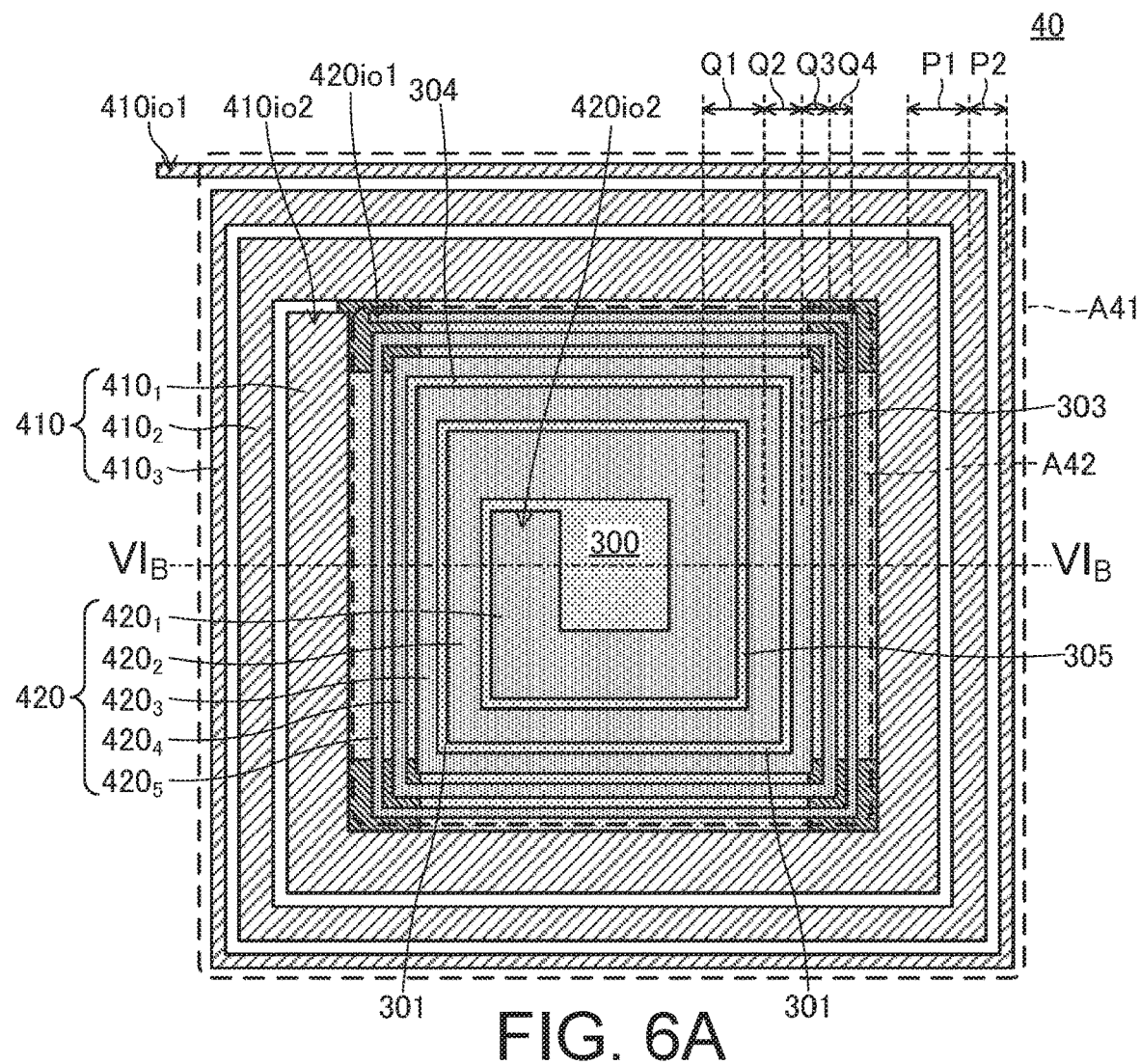
FIG. 6B is a sectional view taken along the line $VI_B$-$VI_B$ of FIG. 6A.
Figure 6B:
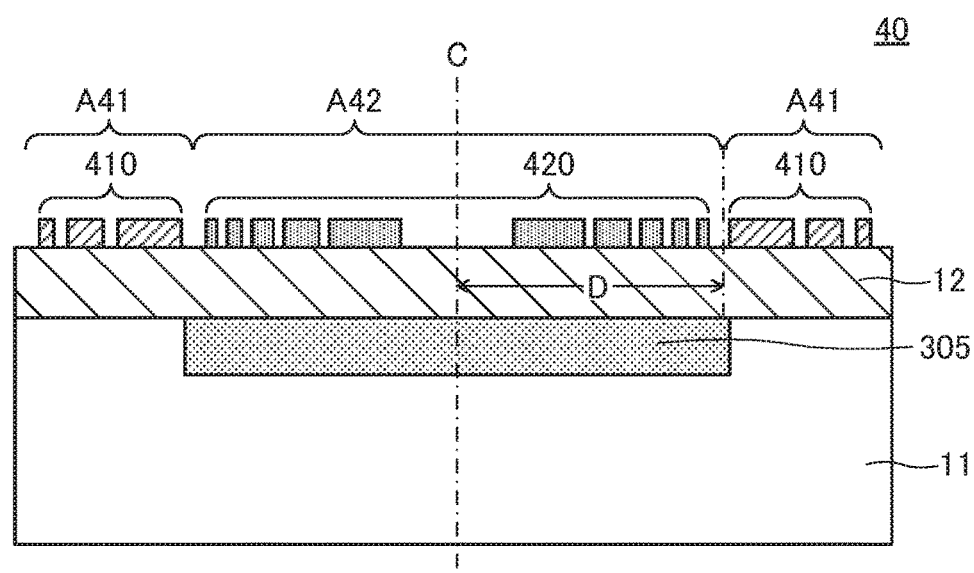

FIG. 6A and FIG. 6B are views for illustrating a magnetic sensor 40 according to a fourth embodiment of the present invention. FIG. 6A is a top view of the magnetic sensor 40, and FIG. 6B is a sectional view taken along the line $VI_B$-$VI_B$ of FIG. 6A.

As illustrated in FIG. 6A and FIG. 6B, the magnetic sensor 40 according to the fourth embodiment includes a Hall element 300 having the same configuration as that of the Hall element in the magnetic sensor 30 according to the third embodiment, that is, the Hall element 300 including the large-size magneto-sensitive portion 305, and excitation wiring including first excitation wiring 410 and second excitation wiring 420.

The excitation wiring 410 is formed in the first wiring region A41 above the magneto-sensitive portion 305 through intermediation of the insulating film 12 formed on the semiconductor substrate 11. The excitation wiring 410 includes a plurality of (in this case, three) conductor portions $410_1$, $410_2$, and $410_3$ arranged in this order across a radial direction from the center axis C of the magneto-sensitive portion 305 (for example, radial direction along the line $VI_B$-$VI_B$), and input/output terminals 410io1 and 410io2 for injecting currents. The center axis C lies in a normal direction to the surface of the magneto-sensitive portion 305. In this case the excitation wiring 410 is a coil formed on the surface and a main portion is made of a single wiring material.

The excitation wiring 420 is formed in a second wiring region A42 positioned on the inner side of the first wiring region A41 above the magneto-sensitive portion 305 through intermediation of the insulating film 12 formed on the semiconductor substrate 11. The excitation wiring 420 includes a plurality of (in this case, five) conductor portions $420_1$, $420_2$, $420_3$, $420_4$, and $420_5$ arranged in this order across the radial direction from the center axis C of the magneto-sensitive portion 305, and input/output terminals 420io1 and 420io2 for injecting currents. In this case the excitation wiring 420 is a coil formed on the surface and a main portion is made of a single wiring material.

Next, a main feature of the magnetic sensor 40 according to the fourth embodiment is described. As illustrated in FIG. 6A, in the conductor portions $410_1$, $410_2$, and $410_3$ of the excitation wiring 410, the intervals P1 and P2 each between the centers of the adjacent conductor portions satisfy an inequality P1>P2. Further, the intervals Q1, Q2, Q3, and Q4 each between the centers of two of the conductor portions $420_1$, $420_2$, $420_3$, $420_4$, and $420_5$ of the excitation wiring 420 satisfy an inequality Q1>Q2>Q3>Q4. That is, in each of the excitation wiring 410 and the excitation wiring 420, the interval between the centers of the adjacent conductor portions decreases as separating away from the center axis C of the magneto-sensitive portion 305 in the radial direction. Further, also in the fourth embodiment, the width (although not denoted by a reference symbol) of the conductor portion of each of the excitation wiring 410 and the excitation wiring 420 decreases as separating away from the center axis C of the magneto-sensitive portion 305 in the radial direction. Further, as another feature of the fourth embodiment, either the input/output terminals 410*io*1 and 410*io*2 of the excitation wiring 410 are not connected to the input/output terminals 420*io*1 or 420*io*2 of the excitation wiring 420, that is, the excitation wiring 410 and the excitation wiring 420 are electrically isolated from each other.

With this configuration, different currents can be independently applied to the excitation wiring 410 and the excitation wiring 420. Accordingly, currents are applied to the excitation wiring 410 and the excitation wiring 420 through the input/output terminal 410*io*1 or 410*io*2 and the input/output terminal 420*io*1 or 420*io*2, respectively, so that the current flowing through the conductor portions arranged in the wiring region A41 is larger than the current flowing through the conductor portions arranged in the wiring region A42. In this manner, based on the principle similar to that in the third embodiment, even though the magneto-sensitive portion 305 has a large size, the current density distribution as shown in FIG. 1 can be achieved with high approximation accuracy, and a high-accuracy sensitivity test can be performed.

In this case, the magnetic sensor 40 according to the fourth embodiment can be manufactured by a method similar to that for the magnetic sensor 10 according to the first embodiment.

In the fourth embodiment, although the description is given of the configuration in which the excitation wiring includes the first excitation wiring 410 and the second excitation wiring 420, the excitation wiring may further include third excitation wiring as required. In this case, it is preferred to supply a current which is different from the currents supplied to the excitation wiring 410 and the excitation wiring 420 to the third excitation wiring through an input/output terminal which is independent from the input/output terminals 410*io*1, 410*io*2, 420*io*1, and 420*io*2. Further, as in the third embodiment, each of the excitation wiring 410 and the excitation wiring 420 may be constituted from an excitation wiring including a plurality of wiring regions and a plurality of excitation sub-wirings.

Fifth Embodiment

Figure 7A:
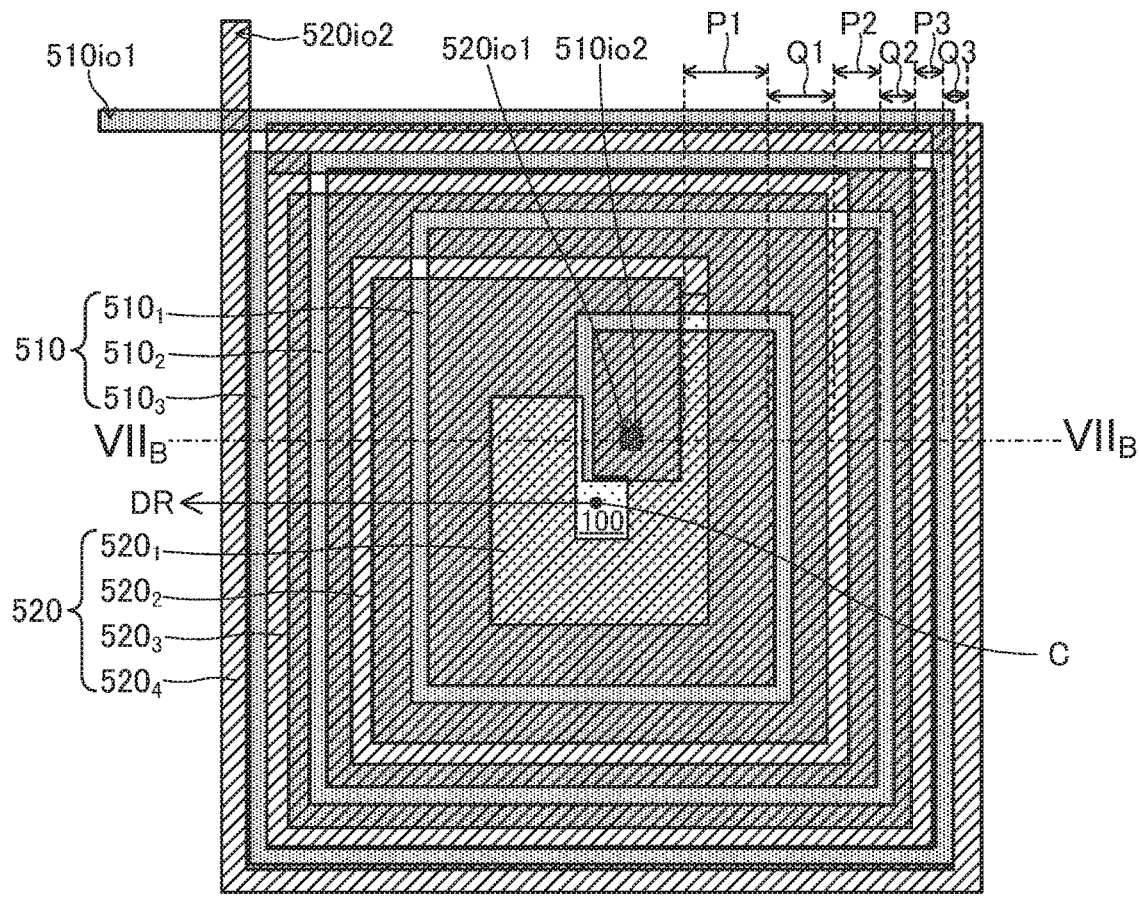
FIG. 7A is a top view for illustrating a magnetic sensor according to a fifth embodiment of the present invention.
Figure 7B:
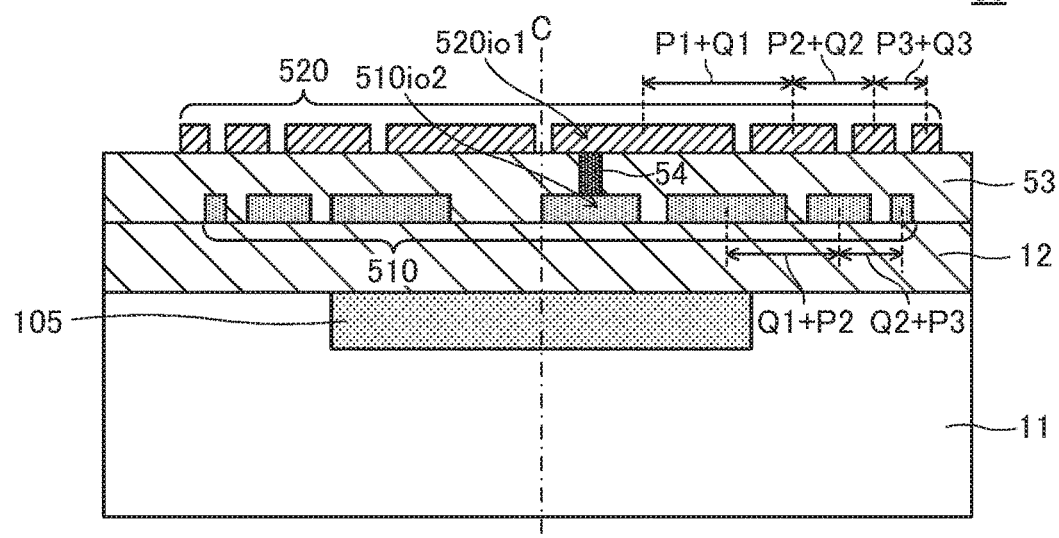
FIG. 7B is a sectional view taken along the line $VII_B$-$VII_B$ of FIG. 7A.

FIG. 7A and FIG. 7B are views for illustrating a magnetic sensor 50 according to a fifth embodiment of the present invention. FIG. 7A is a top view of the magnetic sensor 50, and FIG. 7B is a sectional view taken along the line VII$_B$-VII$_B$ of FIG. 7A.

As illustrated in FIG. 7A and FIG. 7B, the magnetic sensor 50 according to the fifth embodiment includes a Hall element 100 having the same configuration as that of the Hall element in the magnetic sensor 10 according to the first embodiment, and excitation wiring including first excitation wiring 510 and second excitation wiring 520.

The excitation wiring 510 is formed above the magneto-sensitive portion 105 through intermediation of the insulating film 12 formed on the semiconductor substrate 11. The excitation wiring 510 includes a plurality of (in this case, three) conductor portions $510_1$, $510_2$, and $510_3$ arranged in this order across a radial direction from the center axis C of the magneto-sensitive portion 105 (for example, radial direction DR), and input/output terminals 510*io*1 and 510*io*2 for injecting currents. The center axis C lies in a normal direction to the surface of the magneto-sensitive portion 105. In this case the excitation wiring 510 is a coil formed on the surface and a main portion is made of a single wiring material.

The excitation wiring 520 is formed above the excitation wiring 510 through intermediation of an interlayer insulating film 53. The excitation wiring 520 includes a plurality of (in this case, four) conductor portions $520_1$, $520_2$, $520_3$, and $520_4$ arranged in this order across a radial direction from the center axis C of the magneto-sensitive portion 105 (for example, radial direction DR), and input/output terminals 520*io*1 and 520*io*2 for injecting currents. In this case the excitation wiring 520 is a coil formed on the surface and a main portion is made of a single wiring material.

Further, as illustrated in FIG. 7B, the input/output terminals 510*io*2 and 520*io*1 are connected to each other through a contact plug 54 so that the excitation wiring 510 and the excitation wiring 520 are connected in series.

Next, a main feature of the magnetic sensor 50 according to the fifth embodiment is described. As illustrated in FIG. 7A, an interval between centers of the conductor portion $520_1$ and the conductor portion $510_1$ is denoted by P1, and an interval between centers of the conductor portion $510_1$ and the conductor portion $520_2$ is denoted by Q1. An interval between centers of the conductor portion $520_2$ and the conductor portion $510_2$ is denoted by P2, and an interval between centers of the conductor portion $510_2$ and the conductor portion $520_3$ is denoted by Q2. An interval between centers of the conductor portion $520_3$ and the conductor portion $510_3$ is denoted by P3, and an interval between centers of the conductor portion $510_3$ and the conductor portion $520_4$ is denoted by Q3. In this case, as illustrated in FIG. 7B, inequalities P1+Q1>P2+Q2>P3+Q3 and Q1+P2>Q2+P3 hold. That is, in each of the excitation wiring 510 and the excitation wiring 520, the interval between the centers of the conductor portions decreases as separating away from the center axis C of the magneto-sensitive portion 105 in the radial direction. Further, as another feature of the fifth embodiment, the conductor portions of the excitation wiring 520 are arranged between the conductor portions of the excitation wiring 510.

With this configuration, the current density distribution shown in FIG. 1 can be achieved with accuracy higher than that of the first embodiment. In addition, excitation wiring with more excellent electromigration resistance and higher reliability can be obtained. The reason is described in the following.

When the interval between the centers of the conductor portions is made smaller as separating away from the center axis C, the width of the conductor portion should also be made smaller. Presence of a conductor portion having a small width may cause reduction in reliability including lowering of resistance to electromigration. On the other hand, when the interval between the centers of the conductor portions is made larger, the approximation accuracy with respect to the current density distribution shown in FIG. 1 reduces, and the uniformity of the test magnetic field reduces since the distribution of the current density of the current flowing through the excitation wiring becomes discrete. In the fifth embodiment, as illustrated in FIG. 7B, the conductor portions of the excitation wiring 520 are arranged between the conductor portions of the excitation wiring 510, and further, the excitation wiring 510 and the excitation wiring 520 are connected to each other in series as described above. Accordingly, when predetermined currents are supplied to the excitation wiring 510 and the excitation wiring 520 through the input/output terminal 510io1 and the input/output terminal 520io2, respectively, a test magnetic field Bt1+Bt2 obtained by combining a magnetic field Bt1 caused by the excitation wiring 510 and a magnetic field Bt2 caused by the excitation wiring 520 is applied to the magneto-sensitive portion 105. In this case, the test magnetic field Bt1+Bt2 is substantially the same as the test magnetic field obtained from one-layer excitation wiring of which the intervals of the conductor portions are set as P1, Q1, P2, Q2, P3, and Q3. That is, according to the fifth embodiment, the interval between the centers of the conductor portions and the width of the conductor portion of the excitation wiring can be made larger while the uniformity of the test magnetic field is maintained.

Next, a specific method of manufacturing the magnetic sensor 50 according to the fifth embodiment is described. In the fifth embodiment, the Hall element 100 and the excitation wiring 510 can be manufactured by a method similar to that in the first embodiment. After the excitation wiring 510 is formed, the interlayer insulating film 53 is formed. In this case, the interlayer insulating film 53 can be formed by, for example, chemical vapor deposition of a silicon oxide film or by spin coating of spin-on-glass. Further, it is preferred to flatten the surface of the interlayer insulating film 53 by chemical mechanical polishing or etch back. The excitation wiring 520 can be formed by, for example, sputtering an aluminum film on the interlayer insulating film 53, and then subjecting the aluminum film to photolithography and etching. The excitation wiring 510 and the excitation wiring 520 can be electrically connected to each other in series through the contact plug 54 obtained by forming a via that passes through the interlayer insulating film 53 and embedding a conductor into the via by, for example, chemical vapor deposition of tungsten.

In the fifth embodiment, a description is given for the example of the case in which the conductor portions of the excitation wiring 520 are arranged between all the conductor portions of the excitation wiring 510. However, it is only necessary that the current density distribution shown in FIG. 1 be achieved when the distribution of the current density of the current flowing through the excitation wiring 510 and the distribution of the current density of the current flowing through the excitation wiring 520 are considered in combination, and arrangement of the conductor portions other than that illustrated in FIG. 7A and FIG. 7B is not excluded.

Further, in the fifth embodiment, a description is given of the case in which the currents flow through the excitation wiring 510 and the excitation wiring 520 in the same direction. However, for example, the spiral excitation wiring 520 and the spiral excitation wiring 510 may have opposite winding direction, and may be connected to each other so that the direction of the current flowing through the excitation wiring 520 and the direction of the current flowing through the excitation wiring 510 are opposite to each other. In this case, it is preferred that, in the excitation wiring 520, the conductor portions be arranged so that the interval between the centers of the conductor portions increases as separating away from the center axis C in the radial direction DR, and in the excitation wiring 510, the conductor portions be arranged so that the interval between the centers of the conductor portions decreases as separating away from the center axis C in the radial direction. With this configuration, a current density Jc1 in the excitation wiring 510 decreases as approaching the center axis C, and a current density Jc2 in the excitation wiring 520 has a sign opposite to that of the current density Jc1, and increases as approaching the center axis C. As a result, a current density Jc1+Jc2 obtained by adding the current density Jc1 in the excitation wiring 510 to the current density Jc2 in the excitation wiring 520 more greatly decreases as approaching the center axis C as compared to the current density Jc1. That is, when the current density Jc1+Jc2 approximately achieves the current density distribution shown in FIG. 1, the distribution of the current density Jc1 is gentler than the current density distribution shown in FIG. 1. As a result, the interval between the centers of the conductor portions and the width of the conductor portion in the excitation wiring 510 can be made larger than those in the first embodiment. Thus, an effect equivalent to the above-mentioned effect that can be obtained by the configuration illustrated in FIG. 7A and FIG. 7B can be obtained.

Further, in the fifth embodiment, although a description is given for the example of the structure in which the excitation wiring 510 and the excitation wiring 520 are electrically connected in series by the contact plug 54, similarly to the fourth embodiment, the input/output terminals 510io2 and 520io1 may not be electrically connected to each other, and different currents may be independently applied to the input/output terminals 510io2 and 520io1.

Further, in the fifth embodiment, although a description is given for the example of the structure in which the excitation wiring is constituted only from the first excitation wiring 510 and the second excitation wiring 520, the excitation wiring may further include the third excitation wiring as required.

Further, the third excitation wiring (not shown) unrelated to the test magnetic field may be connected to the first excitation wiring 510 in parallel to the second excitation wiring 520 so that the current flowing through the first excitation wiring 510 differs from the current flowing through the second excitation wiring 520. Further, similarly to the magnetic sensor 30 of the third embodiment illustrated in FIGS. 4A and 4B, each of the excitation wiring 510 and the excitation wiring 520 may be constituted from an excitation wiring including a plurality of wiring regions and a plurality of excitation sub-wirings.

Sixth Embodiment

Figure 8A:
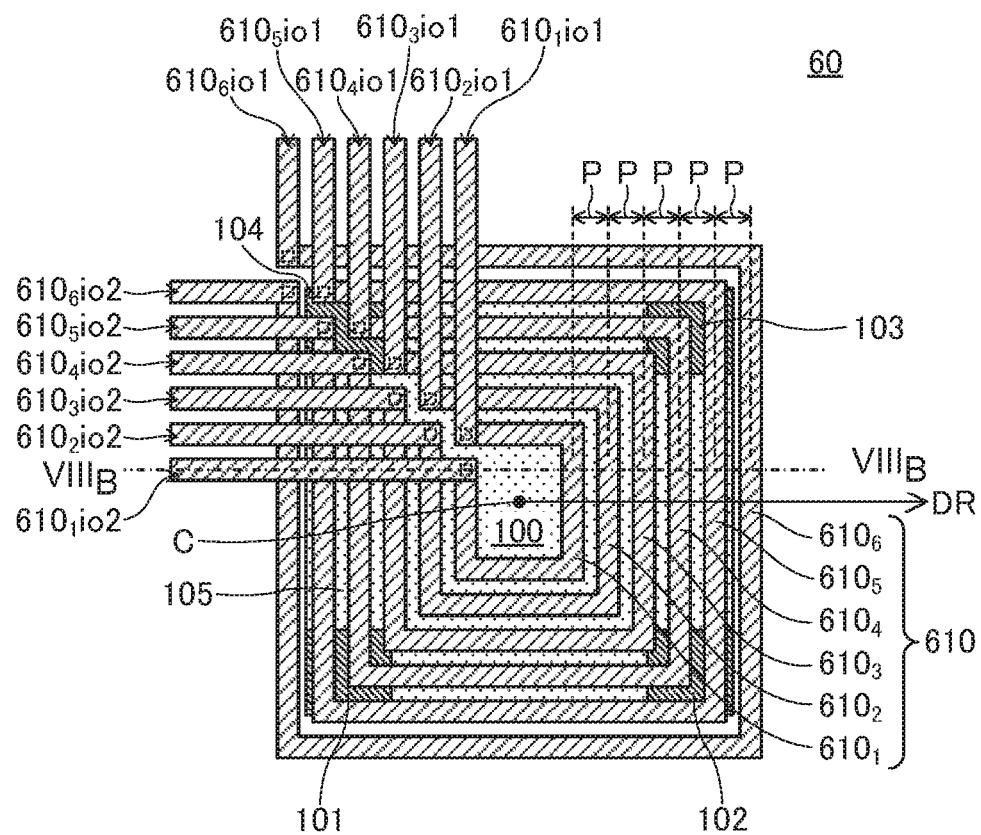
FIG. 8A is a top view for illustrating a magnetic sensor according to a sixth embodiment of the present invention.
Figure 8B:
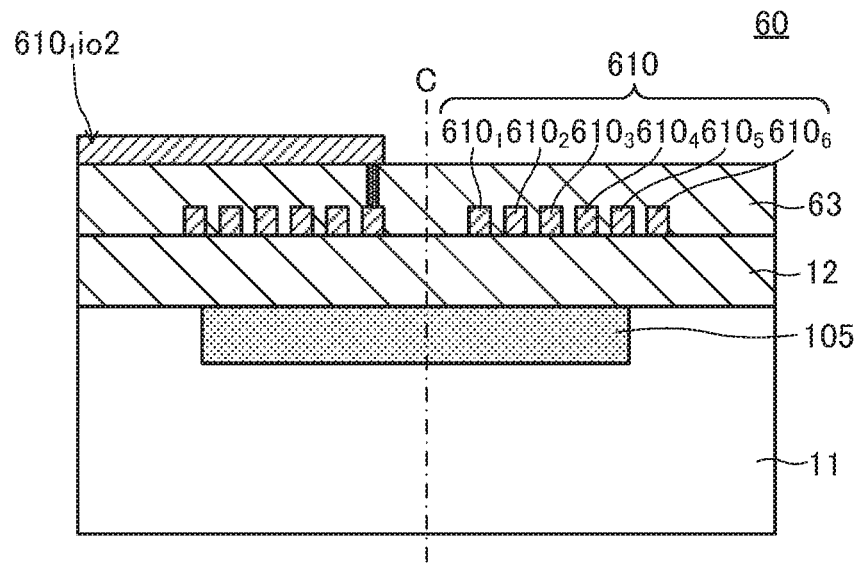
FIG. 8B is a sectional view taken along the line of FIG. 8A.

FIG. 8A and FIG. 8B are views for illustrating a magnetic sensor 60 according to the sixth embodiment of the present invention. FIG. 8A is a top view of the magnetic sensor 60, and FIG. 8B is a sectional view taken along the line VIII$_B$-VIII$_B$ of FIG. 8A.

As illustrated in FIG. 8A and FIG. 8B, the magnetic sensor 60 according to the sixth embodiment includes a Hall element 100 which has the same configuration as that of the Hall element in the magnetic sensor 10 according to the first embodiment and excitation wiring 610.

The excitation wiring 610 is formed above the magneto-sensitive portion 105 through intermediation of the insulating film 12 formed on the semiconductor substrate 11. The excitation wiring 610 includes a plurality of (in this case, six) conductor portions $610_1$, $610_2$, $610_3$, $610_4$, $610_5$, and $610_6$ arranged in this order across at least one radial direction from the center axis C of the magneto-sensitive portion 105

(for example, radial direction DR). The center axis C lies in a normal direction to the surface of the magneto-sensitive portion 105.

Next, a main feature of the magnetic sensor 60 according to the sixth embodiment is described. As illustrated in FIG. 8A, the magnetic sensor 60 has equal intervals P between centers of adjacent conductor portions. Further, in the magnetic sensor 60, as illustrated in FIG. 8A, each conductor portion $610_i$ (i=1, 2, 3, 4, 5, and 6) includes input/output terminals $610_i$io1 and $610_i$io2 for injecting currents, and is independent among them. That is, each conductor portion $610_i$; (i=1, 2, 3, 4, 5, and 6) is electrically isolated mutually among them.

With this configuration, when a center coordinate of each conductor portion i denoted by "xi", and a current flowing through each conductor portion is denoted by "Ici" (i=1, 2, 3, 4, 5, and 6), the current Ici is supplied to the excitation wiring 610 through each input/output terminal $610_i$io1 or $610_i$io2 so that the relationship between the current Ici and the center coordinate xi matches the current density distribution shown in FIG. 1. In this manner, a uniform test magnetic field can be applied to the magneto-sensitive portion 105.

In this case, the magnetic sensor 60 according to the sixth embodiment can be manufactured by a method similar to that for the magnetic sensor 10 according to the first embodiment.

Seventh Embodiment

Figure 9:
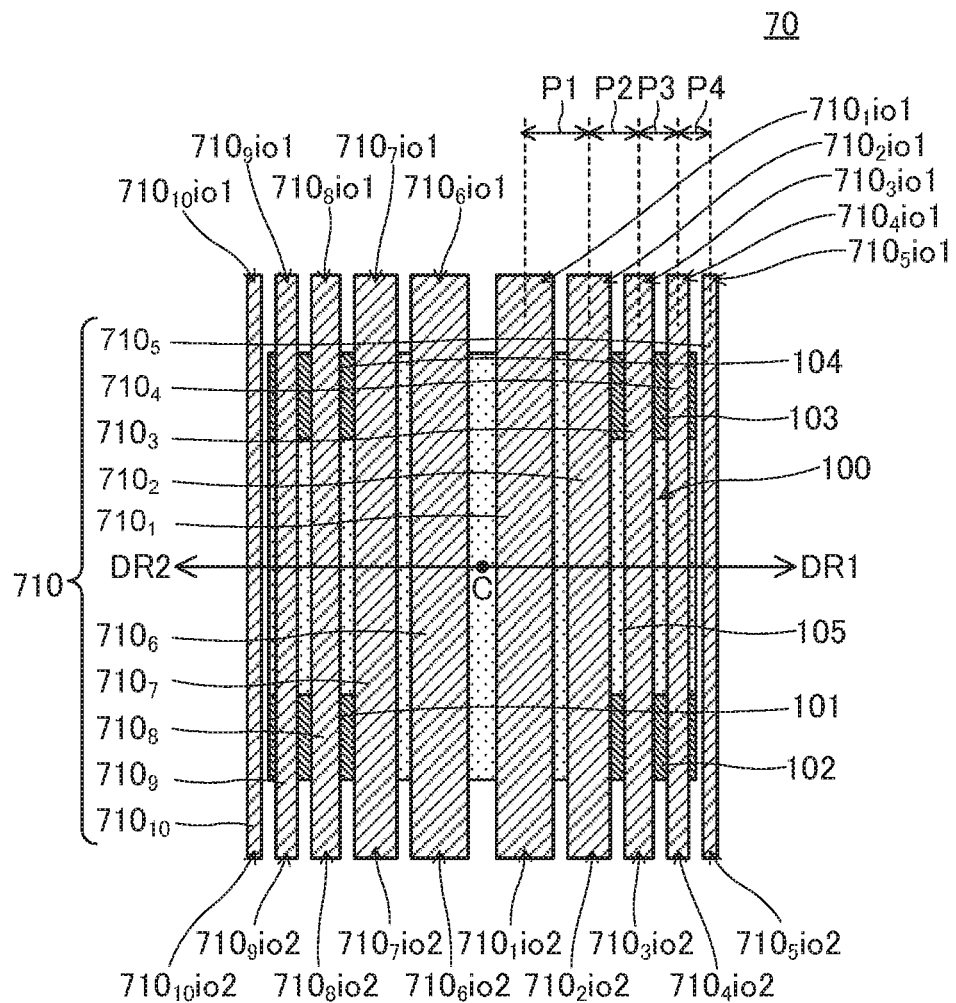
FIG. 9 is a top view for illustrating a magnetic sensor according to a seventh embodiment of the present invention.
Figure 10:
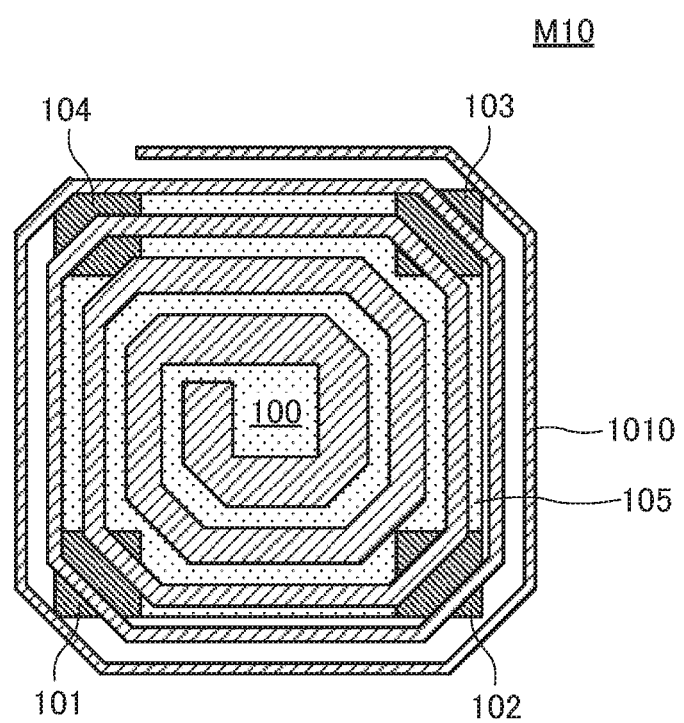
FIG. 10 is a top view for illustrating a magnetic sensor according to the first modification example of the embodiments of the present invention.
Figure 11:
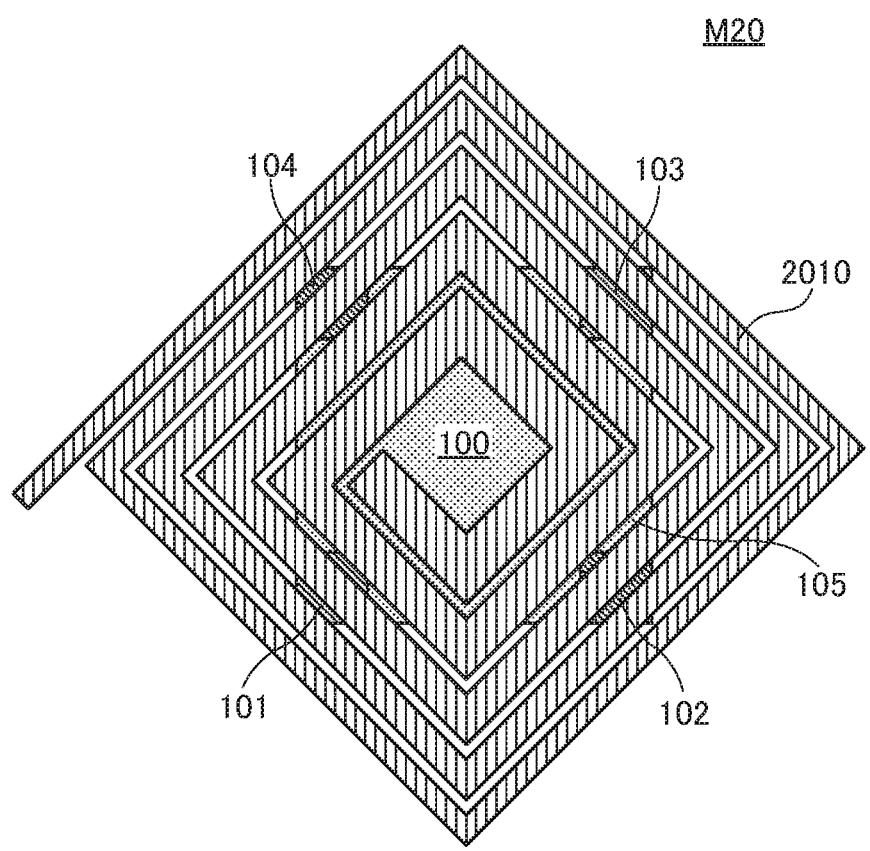
FIG. 11 is a top view for illustrating a magnetic sensor according to the second modification example of the embodiments of the present invention.
Figure 12:
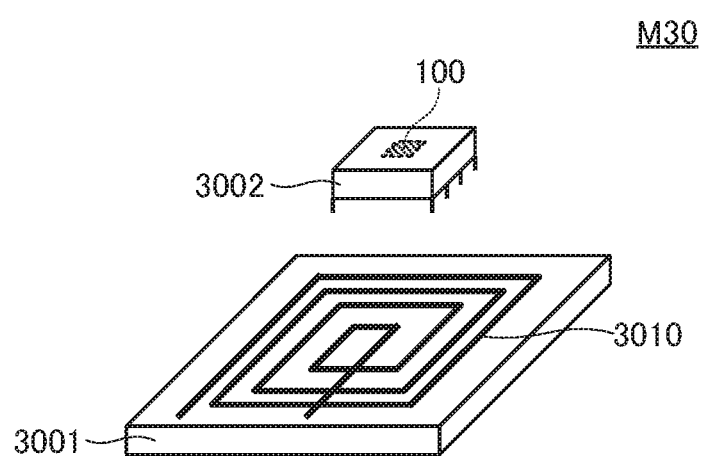
FIG. 12 is a perspective view for illustrating a magnetic sensor according to the third modification example of the embodiments of the present invention.

FIG. 9 is a top view for illustrating a magnetic sensor 70 according to a seventh embodiment of the present invention. A sectional view of the magnetic sensor 70 is substantially the same as that of the magnetic sensor 20 according to the second embodiment which is illustrated in FIG. 3B, and hence illustration thereof is omitted herein.

As illustrated in FIG. 9, the magnetic sensor 70 according to the seventh embodiment includes a Hall element 100 which has the same configuration as that of the Hall element in the magnetic sensor 10 according to the first embodiment, and excitation wiring 710.

The excitation wiring 710 is formed above the magneto-sensitive portion 105 through intermediation of the insulating film 12 formed on the semiconductor substrate 11. The excitation wiring 710 includes a plurality of (in this case, five) linear conductor portions $710_1$, $710_2$, $710_3$, $710_4$, and $710_5$ arranged in this order across at least one radial direction DR1 from the center axis C of the magneto-sensitive portion 105, and a plurality of (in this case, five) linear conductor portions $710_6$, $710_7$, $710_8$, $710_9$, and $710_{10}$ arranged in this order across at least one radial direction DR2 from the center axis C of the magneto-sensitive portion 105.

Next, a main feature of the magnetic sensor 70 according to the seventh embodiment is described. As illustrated in FIG. 9 in the magnetic sensor 70, the intervals P1, P2, P3, and P4 between centers of adjacent two of the conductor portions $710_1$, $710_2$, $710_3$, $710_4$, and $710_5$ satisfy an inequality P1>P2>P3>P4, and also the intervals (although not denoted by reference symbols) between centers of adjacent two of the conductor portions $710_6$, $710_7$, $710_8$, $710_9$, and $710_{40}$ have a relationship similar to that of the intervals P1, P2, P3, and P4. That is, the interval between the centers of the adjacent conductor portions decreases as separating away from the center axis C of the magneto-sensitive portion 105 in each of the radial directions DR1 and DR2.

Further, in the magnetic sensor 70, as illustrated in FIG. 9, each conductor portion $710_i$ (i=1, 2, 3, 4, 5, 6, 7, 8, 9, and 10) includes input/output terminals $710_i$io1 and $710_i$io2 for injecting current, and is independent among them. That is, each conductor portion $710_i$ (i=1, 2, 3, 4, 5, 6, 7, 8, 9, and 10) is electrically isolated mutually among them. However, in the seventh embodiment, unlike the sixth embodiment, different currents are not supplied to the conductor portions $710_i$. In the seventh embodiment, the current flows in order from the outer conductor portion to the inner conductor portion, and the current is applied to the excitation wiring 710 so that the direction of the current flowing through each of the conductor portions $710_1$, $710_2$, $710_3$, $710_4$, and $710_5$ is opposite to the direction of the current flowing through each of the conductor portions $710_6$, $710_7$, $710_8$, $710_9$, and $710_{10}$. For example, a current is supplied from the input/output terminal $710_5$io1, the current output from the input/output terminal $710_5$io2 is supplied to the input/output terminal $710_{10}$io2, the current output from the input/output terminal $710_{10}$io1 is supplied to the input/output terminal $710_4$io1, and so on.

Even with this configuration, similarly to the above-mentioned embodiments, the current density distribution shown in FIG. 1 can be approximately achieved, and a uniform test magnetic field can be generated over the entire magneto-sensitive portion 105.

In the seventh embodiment, though the description is given of the example in which the excitation wiring is formed of the one-layer excitation wiring 710, excitation wiring having a configuration similar to that of the excitation wiring 710 may be further formed above the excitation wiring 710 through intermediation of an interlayer insulating film in a direction vertical to the excitation wiring 710.

As described above, according to the magnetic sensor of at least one embodiment of the present invention, in the sensitivity test for the magnetic sensor element which uses the test magnetic field generated by applying a current to the excitation wiring, a uniform test magnetic field can be generated over the magneto-sensitive portion of the magnetic sensor element, and a high-accuracy sensitivity test can be performed.

The embodiments of the present invention have been described above, but the present invention is not limited to the above-mentioned embodiments, and it is understood that various modifications can be made thereto without departing from the gist of the present invention.

For example, in the above-mentioned embodiments, a description is given for the example of the case in which the excitation wiring has a square outer shape, and each side of the outer shape of the excitation wiring is parallel to each side of the magneto-sensitive portion, but the present invention is not limited thereto. For example, as in a magnetic sensor M10 according to the first modification example illustrated in FIG. 10, an excitation wiring 1010 may have an octagonal outer shape, or, although not shown, a circular or irregular polygonal outer shape. Further, as in a magnetic sensor M20 according to the second modification example illustrated in FIG. 11, each side of an outer shape of an excitation wiring 2010 may not be parallel to each side of the magneto-sensitive portion 105.

Figure 13A:
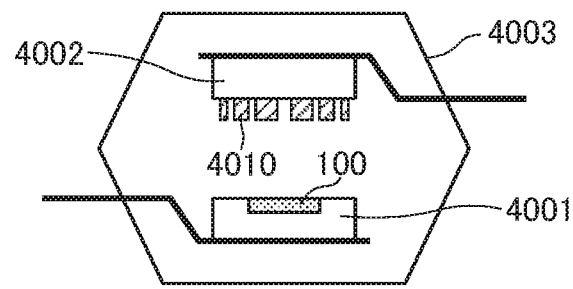
FIG. 13A is a substantial sectional view for illustrating a magnetic sensor including two semiconductor chips according to the fourth modification example of the embodiments of the present invention.
Figure 13B:
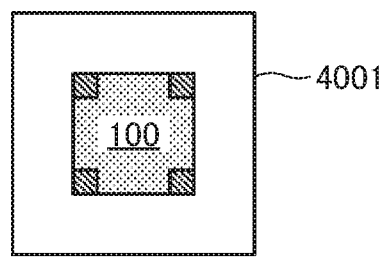
FIG. 13B is a plan view for illustrating one of the two semiconductor chips.
Figure 13C:
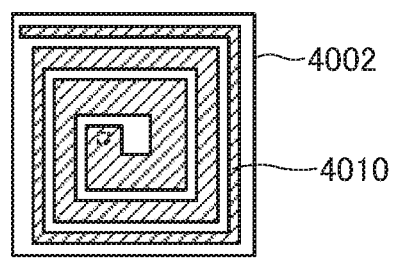
FIG. 13C is a plan view for illustrating the other of the two semiconductor chips.

Further, the excitation wiring may not always be formed on the insulating film formed on the semiconductor substrate. For example, as in a magnetic sensor M30 according to the third modification example illustrated in FIG. 12, an excitation wiring 3010 may be constituted with the use of wiring on a printed board 3001, and a plastic package 3002 incorporating the Hall element 100 may be assembled to the printed board 3001. Alternatively, as in a magnetic sensor M40 according to the fourth modification example illustrated in FIG. 13A, two semiconductor chips 4001 and 4002 may be arranged so as to be opposed to each other in a single plastic package 4003. That is, as illustrated in FIG. 13B, the Hall element 100 may be formed on the surface of the semiconductor chip 4001, and as illustrated in FIG. 13C, excitation wiring 4010 may be formed on the surface of the semiconductor chip 4002. Then the Hall element 100 and the excitation wiring 4010 may be packaged to oppose each other. Alternatively, although not shown, the excitation wiring may be constituted by the wiring arranged in a wafer prober.

Further, the number of conductor portions and the interval between the centers of the conductor portions in the excitation wiring are designed in accordance with the size and the shape of the magneto-sensitive portion. The present invention is not limited to the number and the interval described in the embodiments and the modification examples described above.

Further, in the above-mentioned embodiments, though a description is given of the example in which the Hall element is used as the magnetic sensor element, the type of the magnetic sensor is not limited to the Hall element. The Hall element can be replaced by a magneto-resistive element, a magneto-impedance element, or other elements. In particular, the magneto-resistive element and the magneto-impedance element that have long wiring lengths in order to increase the magnetic field detection sensitivity are preferred to use the excitation wiring according to the present invention when a magnetic field is to be uniformly applied to the entire magneto-sensitive portion.

Further, in the above-mentioned embodiments, a description is given of the example in which the excitation wiring is formed with the use of the aluminum wiring step of the semiconductor manufacturing process, but the excitation wiring may be formed with the use of a conductor film made of a material other than aluminum.

What is claimed is:

1. A magnetic sensor, comprising:
    a magneto-sensitive portion; and
    an excitation wiring formed in a wiring region above the magneto-sensitive portion through intermediation of an insulating film, the excitation wiring having a plurality of conductor portions arranged in order across at least one radial direction from a center axis of the magneto-sensitive portion, the center axis being normal to a surface of the magneto-sensitive portion;
    a current flowing through the excitation wiring having a current density of which an absolute value becomes zero in a vicinity of a center of the magneto-sensitive portion and continuously increases toward an outer side of the magneto-sensitive portion; and
    a magnetic field generated by the current flowing through the excitation wiring in a direction vertical to the surface of the magneto-sensitive portion,
    wherein an interval between centers of two of the plurality of conductor portions which are adjacent to each other along the at least one radial direction decreases as separating away from the center axis of the magneto-sensitive portion.

2. The magnetic sensor according to claim 1, wherein a width of each of the plurality of conductor portions along the at least one radial direction decreases as separating away from the center axis of the magneto-sensitive portion.

3. The magnetic sensor according to claim 1,
    wherein the wiring region comprises:
        a first wiring region; and
        a second wiring region located on an inner side of the first wiring region,
    wherein the excitation wiring comprises:
        a first excitation wiring formed in the first wiring region; and
        a second excitation wiring and a third excitation wiring formed in the second wiring region,
    wherein the plurality of conductor portions comprises:
        a plurality of first conductor portions forming the first excitation wiring, the plurality of first conductor portions arranged in order across the at least one radial direction;
        a plurality of second conductor portions forming the second excitation wiring, the plurality of second conductor portions arranged in order across the at least one radial direction; and
        a plurality of third conductor portions forming the third excitation wiring, the plurality of third conductor portions arranged alternately with the plurality of second conductor portions across the at least one radial direction,
    wherein an interval between centers of two of the plurality of first conductor portions which are adjacent to each other along the at least one radial direction decreases as separating away from the center axis of the magneto-sensitive portion,
    wherein an interval between centers of two of the plurality of second conductor portions which are adjacent to each other along the at least one radial direction decreases as separating away from the center axis of the magneto-sensitive portion,
    wherein an interval between centers of two of the plurality of third conductor portions which are adjacent to each other along the at least one radial direction decreases as separating away from the center axis of the magneto-sensitive portion, and
    wherein the second excitation wiring and the third excitation wiring are electrically connected in parallel to the first excitation wiring.

4. The magnetic sensor according to claim 3,
    wherein a width of each of the plurality of first conductor portions along the at least one radial direction decreases as separating away from the center axis of the magneto-sensitive portion,
    wherein a width of each of the plurality of second conductor portions along the at least one radial direction decreases as separating away from the center axis of the magneto-sensitive portion, and
    wherein a width of each of the plurality of third conductor portions along the at least one radial direction decreases as separating away from the center axis of the magneto-sensitive portion.

5. The magnetic sensor according to claim 1,
    wherein the wiring region comprises:
        a first wiring region; and
        a second wiring region located on an inner side of the first wiring region,
    wherein the excitation wiring comprises:
        a first excitation wiring formed in the first wiring region; and
        a second excitation wiring formed in the second wiring region,
    wherein the plurality of conductor portions comprises:
        a plurality of first conductor portions forming the first excitation wiring, the plurality of first conductor portions arranged in order across the at least one radial direction; and a plurality of second conductor portions forming the second excitation wiring, the plurality of second conductor portions arranged in order across the at least one radial direction, wherein an interval between centers of two of the plurality of first conductor portions which are adjacent to each other along the at least one radial direction decreases as separating away from the center axis of the magneto-sensitive portion, wherein an interval between centers of two of the plurality of second conductor portions which are adjacent to each other along the at least one radial direction decreases as separating away from the center axis of the magneto-sensitive portion, and wherein the first excitation wiring and the second excitation wiring are electrically isolated from each other.

6. The magnetic sensor according to claim 5, wherein a width of each of the plurality of first conductor portions along the at least one radial direction decreases as separating away from the center axis of the magneto-sensitive portion, and wherein a width of the plurality of second conductor portions across the at least one radial direction decreases as separating away from the center axis of the magneto-sensitive portion.

7. The magnetic sensor according to claim 1, wherein the excitation wiring comprises:

a first excitation wiring formed on the insulating film; and a second excitation wiring formed to overlap the first excitation wiring through intermediation of an interlayer insulating film, wherein the plurality of conductor portions comprises:

a plurality of first conductor portions forming the first excitation wiring, the plurality of first conductor portions arranged in order across the at least one radial direction; and a plurality of second conductor portions forming the second excitation wiring, the plurality of second conductor portions arranged in order across the at least one radial direction adjacent to the plurality of first conductor portions, wherein an interval between centers of two of the plurality of first conductor portions which are adjacent to each other in the at least one radial direction decreases as separating away from the center axis of the magneto-sensitive portion, and wherein, along the at least one radial direction, at least one second conductor portion of the plurality of second conductor portions positions between two first conductor portions of the plurality of first conductor portions.

8. The magnetic sensor according to claim 7, wherein a width of the plurality of first conductor portions along the at least one radial direction decreases as separating away from the center axis of the magneto-sensitive portion.

9. The magnetic sensor according to claim 1, wherein an interval between centers of two of the plurality of conductor portions which are adjacent to each other along the at least one radial direction, is constant, and wherein each of the plurality of conductor portions is electrically isolated from each other.

* * * * *